United States Patent
Kim et al.

(10) Patent No.: US 7,410,676 B2
(45) Date of Patent: Aug. 12, 2008

(54) CHEMICAL VAPOR DEPOSITION METHOD

(75) Inventors: Jae-Ho Kim, Seoul (KR); Sang-Joon Park, Daejeon (KR)

(73) Assignee: IPS Ltd., Gyeonggi-do (KR)

( * ) Notice: Subject to any disclaimer, the term of this patent is extended or adjusted under 35 U.S.C. 154(b) by 468 days.

(21) Appl. No.: 11/080,237

(22) Filed: Mar. 14, 2005

(65) Prior Publication Data

US 2005/0217582 A1    Oct. 6, 2005

Related U.S. Application Data

(63) Continuation of application No. 10/102,108, filed on Mar. 19, 2002, now Pat. No. 6,886,491.

(30) Foreign Application Priority Data

Mar. 19, 2001   (KR) ............................. 2001-13995
Mar. 19, 2001   (KR) ............................. 2001-13996

(51) Int. Cl.
    *H05H 1/24* (2006.01)
(52) U.S. Cl. ........................................ 427/569; 117/92
(58) Field of Classification Search ................ 427/569; 117/92
    See application file for complete search history.

(56) References Cited

U.S. PATENT DOCUMENTS

| | | | |
|---|---|---|---|
| 4,971,653 A | 11/1990 | Powell et al. | |
| 5,015,331 A | 5/1991 | Powell | |
| 5,102,523 A | 4/1992 | Beisswenger et al. | |
| 5,304,250 A | 4/1994 | Sameshima et al. | |
| 5,385,624 A | 1/1995 | Amemiya et al. | |
| 5,433,787 A | 7/1995 | Suzuki et al. | |
| 5,562,947 A * | 10/1996 | White et al. | 427/255.5 |
| 5,670,218 A * | 9/1997 | Baek | 427/576 |
| 5,882,414 A | 3/1999 | Fong et al. | |
| 5,902,494 A * | 5/1999 | Gupta et al. | 216/67 |
| 5,968,587 A * | 10/1999 | Frankel | 427/8 |
| 5,997,649 A | 12/1999 | Hillman | |
| 6,013,580 A | 1/2000 | Yanagida | |
| 6,245,396 B1 | 6/2001 | Nogami | |
| 6,435,428 B2 | 8/2002 | Kim et al. | |
| 6,756,318 B2 * | 6/2004 | Nguyen et al. | 438/758 |
| 6,812,157 B1 * | 11/2004 | Gadgil | 438/763 |
| 6,838,125 B2 * | 1/2005 | Chung et al. | 427/562 |

(Continued)

FOREIGN PATENT DOCUMENTS

JP   11168094 A   6/1999

*Primary Examiner*—Bret Chen
(74) *Attorney, Agent, or Firm*—Graybeal Jackson Haley LLP

(57) ABSTRACT

A chemical vapor deposition method comprises steps of: a) injecting a source gas into a chamber so that the source gas is adsorbed on a substrate; b) injecting a purge gas into the chamber for a predetermined period of time so that the source gas remaining in the chamber is purged; c) injecting a reactant gas into a plasma generating portion, and generating plasma at the plasma generating portion by applying a first-level RF power source to a RF electrode plate so that radical of the reactant gas is adsorbed on the substrate; d) injecting a purge gas into the chamber for a predetermined period of time so that the reactant gas remaining in the chamber is purged; and e) applying a second-level RF power source to the plasma generating portion at the step a), b) and d) while the steps a) to d) are being repeated.

3 Claims, 18 Drawing Sheets

U.S. PATENT DOCUMENTS

| | | | |
|---|---|---|---|
| 6,878,402 B2 * | 4/2005 | Chiang et al. | 427/248.1 |
| 2002/0066411 A1 * | 6/2002 | Chiang et al. | 118/724 |
| 2002/0076507 A1 * | 6/2002 | Chiang et al. | 427/569 |
| 2005/0000937 A1 * | 1/2005 | Chiang et al. | 216/59 |

* cited by examiner

CHEMICAL VAPOR DEPOSITION METHOD

This is a continuation application of U.S. patent application Ser. No. 10/102,108 filed 19 Mar. 2002 now U.S. Pat. No. 6,886,491, which is incorporated herein by reference. This continuation application claims benefit of the filing date of the U.S. patent application Ser. No. 10/102,108, Korean Application No. 2001-13995 filed on Mar. 19, 2001, and Korean Application No. 2001-13996 filed on Mar. 19, 2001, (both of which are incorporated herein by this reference) under 35 U.S.C. §120.

BACKGROUND OF THE INVENTION

1. Field of the Invention

The present invention relates to a chemical vapor deposition (CVD) apparatus, and more particularly, to a chemical vapor deposition apparatus which uses radicals of reactant gases while supplying process gases in sequence by generating plasma within a showerhead or injecting exterior plasma into a chamber through the showerhead.

2. Description of the Prior Art

Generally, in order to obtain excellent step coverage and film quality characteristics at low temperature, source gases and reactant gases are supplied to a chemical vapor deposition apparatus in sequence. Herein, a conventional chemical vapor deposition apparatus in which process gases are sequentially supplied will be briefly described with reference to FIGS. 1A to 1C.

FIG. 1A is a schematic view showing constitutional elements of the conventional chemical vapor deposition apparatus in which the process gases are sequentially supplied. As shown in FIG. 1A, the conventional chemical vapor deposition apparatus comprises a chamber 101 with an outlet 100 disposed at a lower portion thereof, at least one source gas introduction tube 102 mounted on a top surface of the chamber so as to penetrate into an inner central portion of the chamber 101, at least one reactant gas introduction tube 103 and at least one purge gas introduction tube 104, a showerhead 106 with a plurality of injection holes 105 formed therein for injecting the process gases, and a heater 108 for supporting a wafer or substrate 107 (hereinafter, referred to as a "substrate") on which a thin film is deposited from the process gases injected through the showerhead 106 and for simultaneously functioning as a heat source.

In order to form the thin film on the substrate 107 by using the conventional chemical vapor deposition apparatus constructed as such, the source gases introduced from the at least one source gas introduction tube 102 are injected through the showerhead 106 for a predetermined period of time to be adsorbed by the substrate 107, and the purge gas is then introduced from the at least one purge gas introduction tube 104 for a predetermined period of time so as to purge the source gases remaining in the showerhead 106 and the chamber 101. Subsequently, the gases are discharged through the outlet 100. Thereafter, the reactant gases introduced through the at least one reactant gas introduction tube 103 are injected through the showerhead 106 onto the substrate 107 for a predetermined period of time, and consequently, a thin film is formed on the substrate through the predetermined reaction of the reactant gases with source gases adsorbed in the substrate 107. Further, before the source gases are injected again, the reactant gases and reaction byproduct gases remaining in the showerhead 106 and the chamber 101 are purged by using the purge gas for a predetermined period of time and then discharged. As described above, the thin film is deposited on the substrate 107 by repeating the processes of injecting and purging the source gases, and injecting and purging the reactant gases.

However, the technology using such a conventional chemical vapor deposition apparatus has a disadvantage of a very low deposition rate, and becomes a cause of increase in fabrication costs of a semiconductor when it is applied to a mass-production process of the semiconductor.

FIG. 1B is a schematic view showing a conventional plasma chemical vapor deposition apparatus in which the process gases are sequentially supplied and which is constructed to make up for the disadvantages of the chemical vapor deposition apparatus shown in FIG. 1A. That is, as shown in FIG. 1B, the conventional plasma chemical vapor deposition apparatus is constructed in such a manner that the showerhead 106 is provided with an RF power source connection portion 109 which in turn is connected to an external RF power source 110, and that an insulating portion 111 for electrically insulating the showerhead 106 to which the RF power source 110 has been connected is installed on the showerhead 106, thereby generating the plasma directly within the chamber 101.

That is, although the plasma chemical vapor deposition apparatus shown in FIG. 1B has a conventional sequential process gas supply system in which the processes of injecting and purging the source gases, and injecting and purging the reactant gases are repeated in the same way as the chemical vapor deposition apparatus shown in FIG. 1A, it is constructed to ensure a fast reaction rate at a lower temperature by directly generating the plasma directly within the chamber 101 upon injection of the reactant gases and inducing reactions of the plasma of the reactant gases with the source gases adsorbed in the substrate 107.

The direct plasma generating system shown in FIG. 1B ensures a slightly faster deposition rate at a relatively low temperature as compared with the system mentioned with reference to FIG. 1A. However, there is a disadvantage in that the substrate and circuit elements formed on the substrate may be damaged due to generation of arc at an initial stage of the plasma generation, ion bombarding and ion implant, and thus, the yield of the process is reduced.

FIG. 1C is a schematic view showing constitutional elements of a conventional chemical vapor deposition apparatus in which the process gases are sequentially supplied and an external plasma generating apparatus is employed. After the source gases are injected through the showerhead 106 for a predetermined period of time, the purge gas causes the source gases remaining in the showerhead 106 and the chamber 101 to be purged and discharged through the outlet 100 formed on a side of the chamber 101. After such purging of the source gases, the plasma of the reactant gases is injected through an external plasma generating apparatus 112 directly into the chamber 101 and the reactant gases are injected. Then, the reactant gases and the reaction byproduct gases are purged and discharged by using the purge gas.

In such a case that the chemical vapor deposition apparatus having the external plasma generating apparatus is utilized, it is possible to somewhat reduce the damage caused to the substrate and the circuit elements formed on the substrate due to the plasma. However, there is a disadvantage in that a thin film cannot be uniformly deposited on a substrate having a large area due to non-uniformity of the plasma introduced directly into the chamber.

SUMMARY OF THE INVENTION

An object of the present invention is to provide a chemical vapor deposition apparatus which uses radicals of reactant gases while supplying process gases in sequence by generating plasma within a showerhead or injecting exterior plasma into a chamber through the showerhead, thereby avoiding damage to a substrate and circuit elements formed on the substrate, ensuring a fast deposition rate even at low temperature, and depositing a thin film having excellent step coverage and film quality characteristics.

Another object of the present invention is to provide a chemical vapor deposition apparatus which effectively prevents source gases and reactant gases from being mixed with one another within a showerhead by partitioning the showerhead at a predetermined interval to divide it into two sections to separate a first section where the source gases are introduced and injected from a second section where the reactant gases are introduced and injected.

According to a first embodiment of the present invention for achieving the above objects, there is provided a chemical vapor deposition apparatus including a chamber with an outlet formed at a lower portion thereof; a source gas introduction tube, a reactant gas introduction tube and a purge gas introduction tube for respectively supplying process gases into the chamber; a showerhead with a plurality of injection holes for injecting the process gases supplied through the introduction tubes; and a heater for supporting a wafer or substrate on which a thin film is deposited and for serving as a heat source, the apparatus being characterized in that an RF power source connection portion connectable to an external RF power source is installed on an upper side of the chamber; an RF electrode plate is installed within the chamber to be spaced by a predetermined gap from an inner upper surface of the chamber and to be spaced by a predetermined gap from the showerhead disposed below the RF electrode plate; the RF power source connection portion and the RF electrode plate are connected with each other through an RF rod so that electric power is supplied from the external RF power source to the RF electrode plate; plasma is generated in a buffer portion defined by a gap between the RF electrode plate and the showerhead, by means of the electric power applied from the external RF power source to the RF electrode plate; and radicals of reactant gases thus generated are injected onto the wafer or substrate through the showerhead disposed below the buffer portion.

Further, according to a second embodiment of the present invention, an RF power source connection portion connectable to an external RF power source is installed on an upper side of the chamber; an RF electrode plate is installed within the chamber to be spaced by a predetermined gap from an inner upper surface of the chamber and to be spaced by a predetermined gap from an upper surface of the showerhead disposed below the RF electrode plate; the RF power source connection portion and the RF electrode plate are connected with each other through an RF rod so that electric power is supplied from the external RF power source to the RF electrode plate; plasma is generated in a first buffer portion defined by a gap between the RF electrode plate and the upper surface of the showerhead, by means of the electric power applied from the external RF power source to the RF electrode plate; the showerhead is divided into two sections in a vertical direction and a second buffer portion is defined by a space between the two sections; reactant gases are supplied to the first buffer portion where the plasma is generated and are then injected onto the wafer or substrate through the showerhead; and source gases are supplied to the second buffer portion and then injected onto the wafer or substrate through the showerhead.

Moreover, according to a third embodiment of the present invention, an external plasma generating apparatus is connected through a plasma guide tube to an upper side of the chamber to communicate with the chamber; a buffer portion is formed above the showerhead which is disposed below an inner upper surface of the chamber and spaced apart therefrom with a predetermined gap; plasma generated in the external plasma generating apparatus is introduced into the buffer portion through the plasma guide tube; and radicals of reactant gases thus generated are injected onto the wafer or substrate through the showerhead disposed below the buffer portion.

Furthermore, according to a fourth embodiment of the present invention, an external plasma generating apparatus is connected through a plasma guide tube to an upper side of the chamber to communicate therewith; a first buffer portion is formed above the showerhead which is disposed below an upper surface of the chamber to spaced apart therefrom with a predetermined gap; the showerhead is divided into two sections in a vertical direction and a second buffer portion is defined by a space between the two sections; reactant gases and the plasma generated in the external plasma generating apparatus are supplied to the first buffer portion and are then injected onto the wafer or substrate through the showerhead; and source gases are supplied to the second buffer portion and then injected onto the wafer or substrate through the showerhead.

In addition, according to a fifth embodiment of the present invention, an RF power source connection portion connectable to an external RF power source is installed on an inner upper side of the chamber; a first buffer portion is formed above the showerhead which is disposed below an upper surface of the chamber and spaced apart therefrom with a predetermined gap; the RF power source connection portion and an upper surface of the showerhead are connected with each other through an RF rod so that electric power is supplied from the external RF power source to the showerhead; the showerhead is divided into two sections in a vertical direction and a second buffer portion is defined by a space between the two sections; plasma is generated in the second buffer portion by means of the electric power applied from the RF power source to the showerhead and then injected onto the wafer or substrate through the showerhead; and source gases are supplied to the first buffer portion and then injected onto the wafer or substrate through the showerhead.

BRIEF DESCRIPTION OF THE DRAWINGS

The above and other objects, features and advantages of the invention will become more apparent from reading the following description of preferred embodiments taken in connection with the accompanying drawings in which.

DETAILED DESCRIPTION OF THE INVENTION

Hereinafter, chemical vapor deposition apparatuses according to preferred embodiments of the present invention will be described in detail with reference to the accompanying drawings.

First Embodiment

Figure 1A:
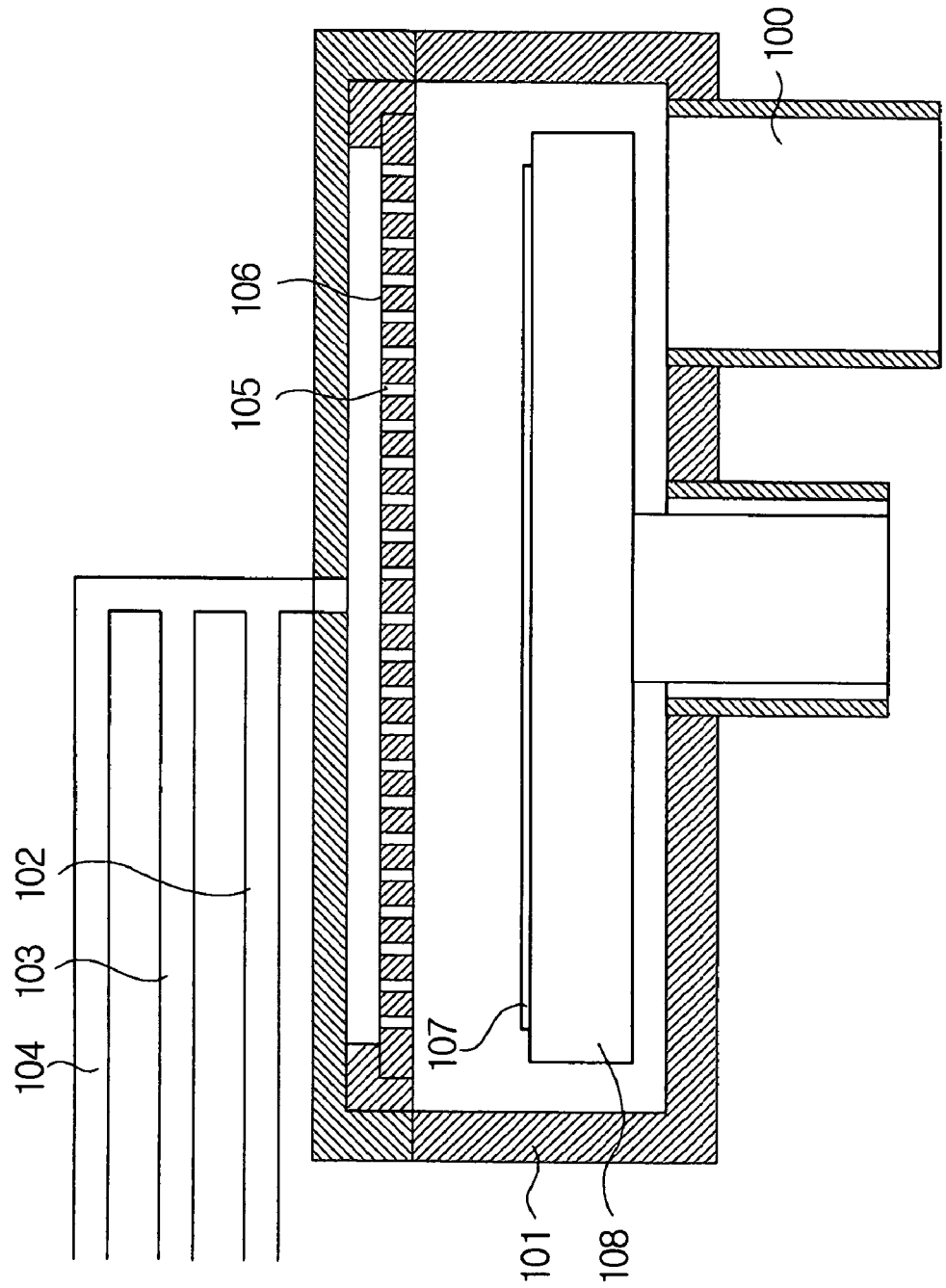
FIG. 1A is a schematic view showing constitutional elements of a conventional chemical vapor deposition apparatus in which process gases are sequentially supplied.
Figure 1B:
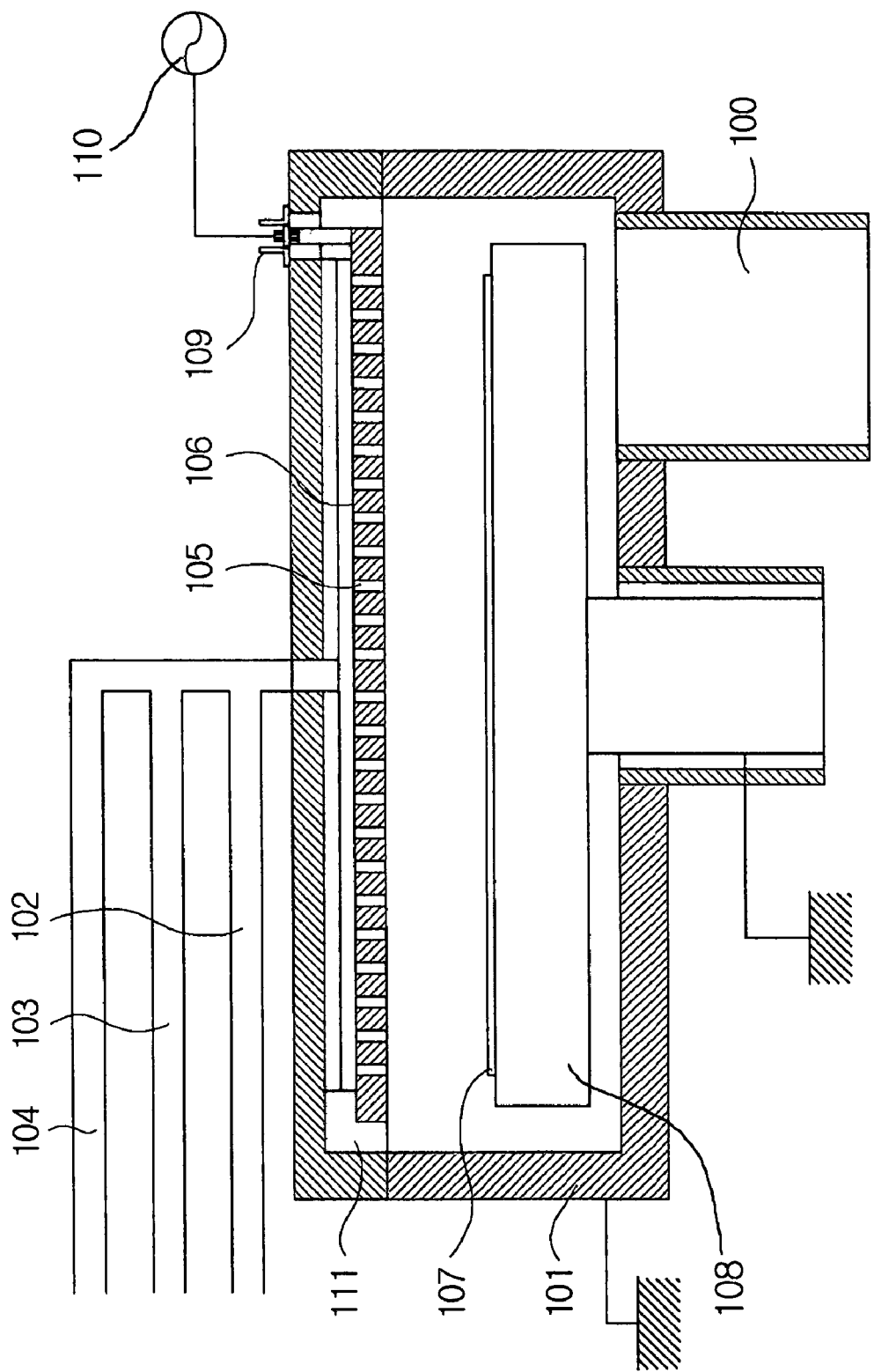
FIG. 1B is a schematic view showing constitutional elements of a conventional plasma chemical vapor deposition apparatus in which the process gases are sequentially supplied.
Figure 1C:
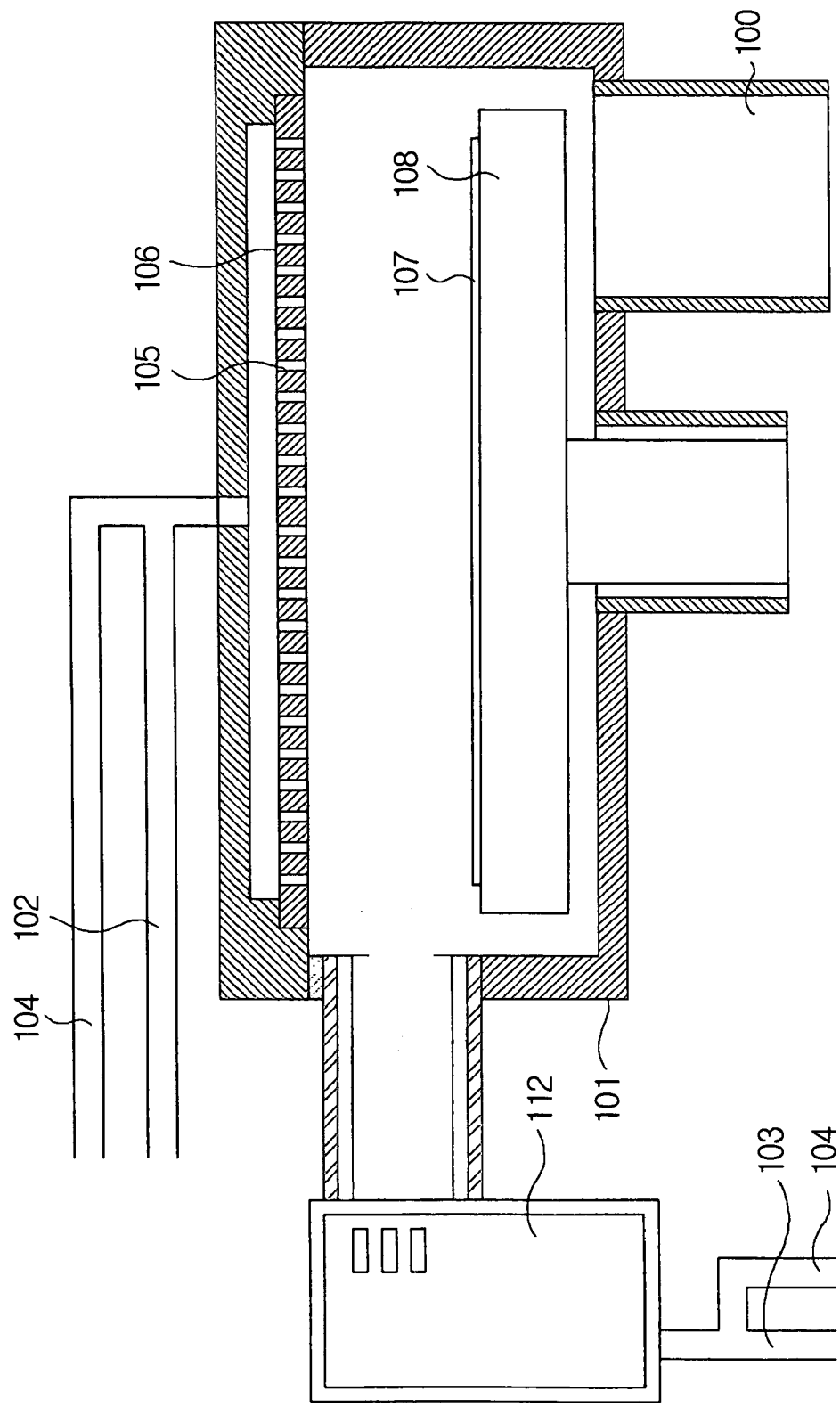
FIG. 1C is a schematic view showing constitutional elements of a conventional plasma chemical vapor deposition apparatus in which the process gases are sequentially supplied and an external plasma generating apparatus is employed.
Figure 2A:
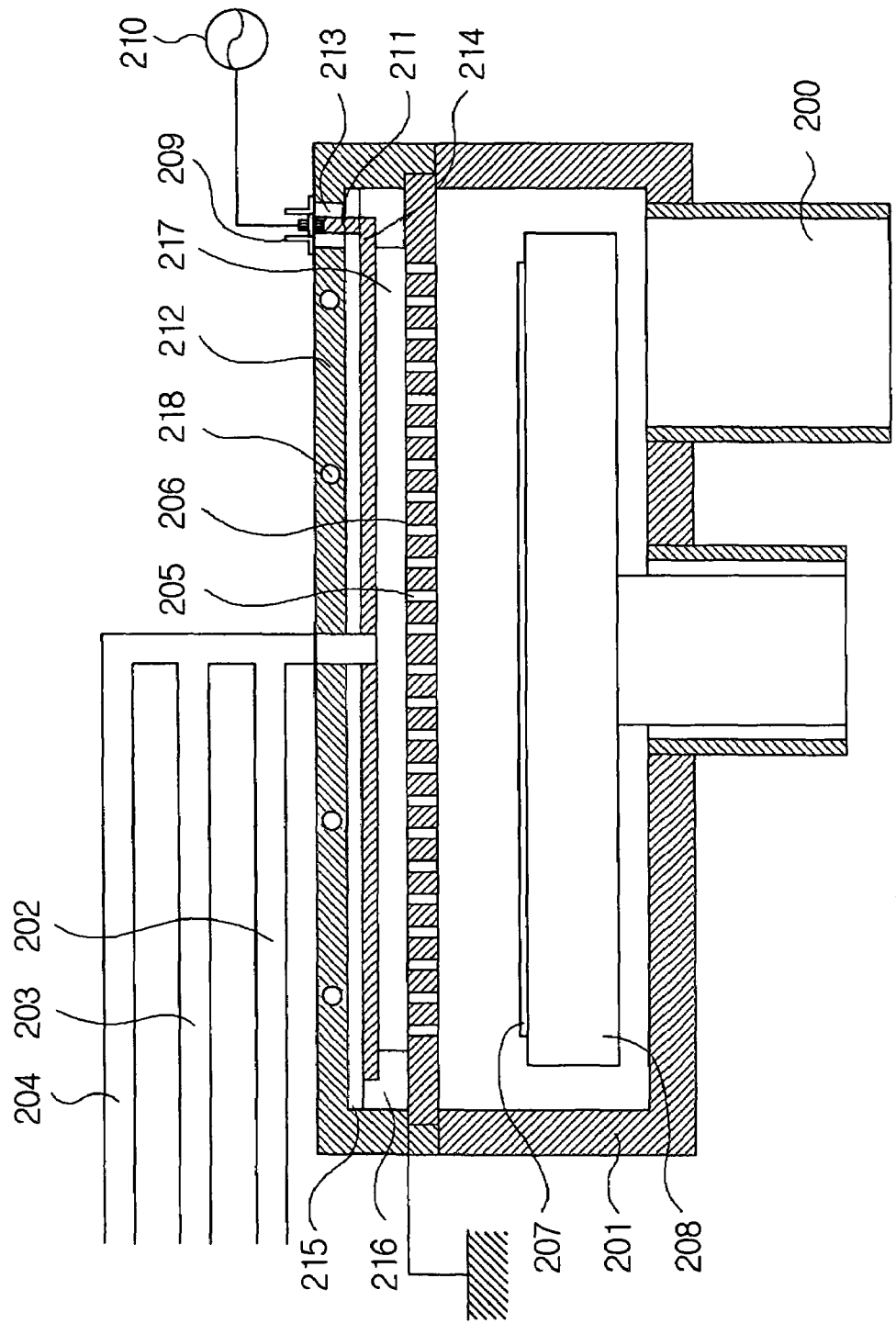
FIG. 2A is a schematic view showing constitutional elements of a radical assisted chemical vapor deposition apparatus in which the process gases are sequentially supplied according to a first embodiment of the present invention.

FIG. 2A is a schematic view showing constitutional elements of a radical assisted chemical vapor deposition apparatus in which process gases are sequentially supplied according to a first embodiment of the present invention.

As can be seen in this figure, the chemical vapor deposition apparatus of the present invention is constructed such that a thin film is formed by sequential supply of process gases consisting of the processes of injecting and purging source gases and injecting and purging reactant gases, where the reactant gases are injected in a state where plasma is generated within a showerhead upon their injection.

As shown in FIG. 2A, in the chemical vapor deposition apparatus of the present invention, an upper plate 212 is mounted on the top of a chamber 201 for constituting a portion of the chamber 201, and an RF power source connection portion 209 which can be connected to an external RF power source 210 is installed on a side of the upper plate 212. The RF power source connection portion 209 is connected to an RF rod 211, and the RF rod 211 is electrically insulated from the upper plate 212 by means of an RF rod insulation portion 213 formed around the RF rod 211.

The RF rod 211 is connected to an RF electrode plate 214 installed on an inner side of the upper plate 212, and plasma is generated within a showerhead 206 by means of such RF electrode plate 214. At this time, in order to electrically insulate the RF electrode plate 214, an upper insulation portion 215 is installed above the RF electrode plate 214, i.e. between the RF electrode plate 214 and the upper plate 212. Further, a lower insulation portion 216 is installed on the bottom of the RF electrode plate 214 in such a manner that a buffer portion 217 is defined with a predetermined gap between the RF electrode plate 214 and the showerhead 206 disposed below the RF electrode plate 214 by means of the lower insulation portion 216. That is, the lower insulation portion 216 causes the RF electrode plate 214 to be insulated from an inner surface of the upper plate 212 and simultaneously to be spaced apart from the showerhead 206 disposed below the RF electrode plate 214 with a the predetermined gap.

The showerhead 206 is installed below the buffer portion having the predetermined gap defined by the lower insulation portion 216, and is formed with a plurality of injection holes 205 for uniformly injecting the process gases. Further, the showerhead 206 is electrically grounded through connection with the upper plate 212. In the chemical vapor deposition apparatus of the present invention constructed as such, the plasma is generated in the buffer portion 217 having the predetermined gap defined by the RF electrode plate 214 installed on the upper plate 212, the lower insulation portion 216 and the showerhead 206.

A heater 208 supports a wafer or substrate 207 (hereinafter, referred to as "substrate") on which a thin film is actually formed and simultaneously supplies the substrate with predetermined thermal energy, within the chamber 201 which is disposed below the upper plate 212 and in which the supplied process gases react with one another.

On an outer side of the upper plate 212 are formed at least one source gas introduction tube 202, at least one reactant gas introduction tube 203 and at least one purge gas introduction tube 204, which communicate with the interior of the upper plate 212. Further, a heater 218 for maintaining the upper plate 212 at a constant temperature is embedded in the upper plate 212. That is, the temperature around the top of the chamber 201 can be kept constant by means of the heater 218.

Hereinafter, a process of forming the thin film on the substrate by using the chemical vapor deposition apparatus of the present invention constructed as mentioned above will be described in detail.

The source gases are introduced for a predetermined period of time through the at least one source gas introduction tube 202 formed on the outer side of the upper plate 212 and are injected through the showerhead 206 so that the source gases are adsorbed on the substrate 207. After such injection of the source gases for the predetermined period of time, the source gases remaining in the showerhead 206 and the chamber 201 are purged and discharged for a predetermined period of time through an outlet 200 installed on a side of the chamber 201 by using a purge gas which is introduced through the at least purge gas introduction tube 204 installed on the outer side of the upper plate 212.

Then, the reactant gases, which are introduced through the at least one reactant gas introduction tube 203 installed on the outer side of the upper plate 212, are injected through the showerhead 206 onto the substrate 207 for a predetermined period of time so as to induce reactions of the injected reactant gases with the source gases adsorbed on the substrate 207 and to form the thin film on the substrate 207. At this time, the reactions of the injected reactant gases with the source gases adsorbed on the substrate 207 are further activated by applying electric power from the RF power source 210 to the RF electrode plate 214 to generate the plasma within the buffer portion 217 and injecting radicals of the reactant gases through the showerhead 206.

After injecting the radicals of the reactant gases for the predetermined period of time, the reactant gases remaining in the showerhead 206 and the chamber 201 are purged and discharged for a predetermined period of time by using the purge gas which is introduced through the purge gas introduction tube 204. Thus, the present invention allows the thin film to be formed on the wafer or substrate by repeating the sequential supply of the process gases consisting of the processes of injecting and purging the source gases, injecting the radicals of the reactant gases, and purging the reactant gases.

In such a way, the chemical vapor deposition apparatus of the present invention can ensure a fast deposition rate at a lower temperature and form a thin film having excellent step coverage and film quality characteristics on the substrate by further activating the reactions of the reactant gases with the source gases adsorbed on the wafer or substrate by means of the plasma generated in the buffer portion 217. Moreover, according to the chemical vapor deposition apparatus of the present invention, since the plasma is not exposed directly to the chamber and the substrate, it is possible to prevent the substrate and circuit elements formed thereon from being physically damaged due to arc which may be produced during generation of the plasma, ion bombarding and ion implant.

Figure 2B:
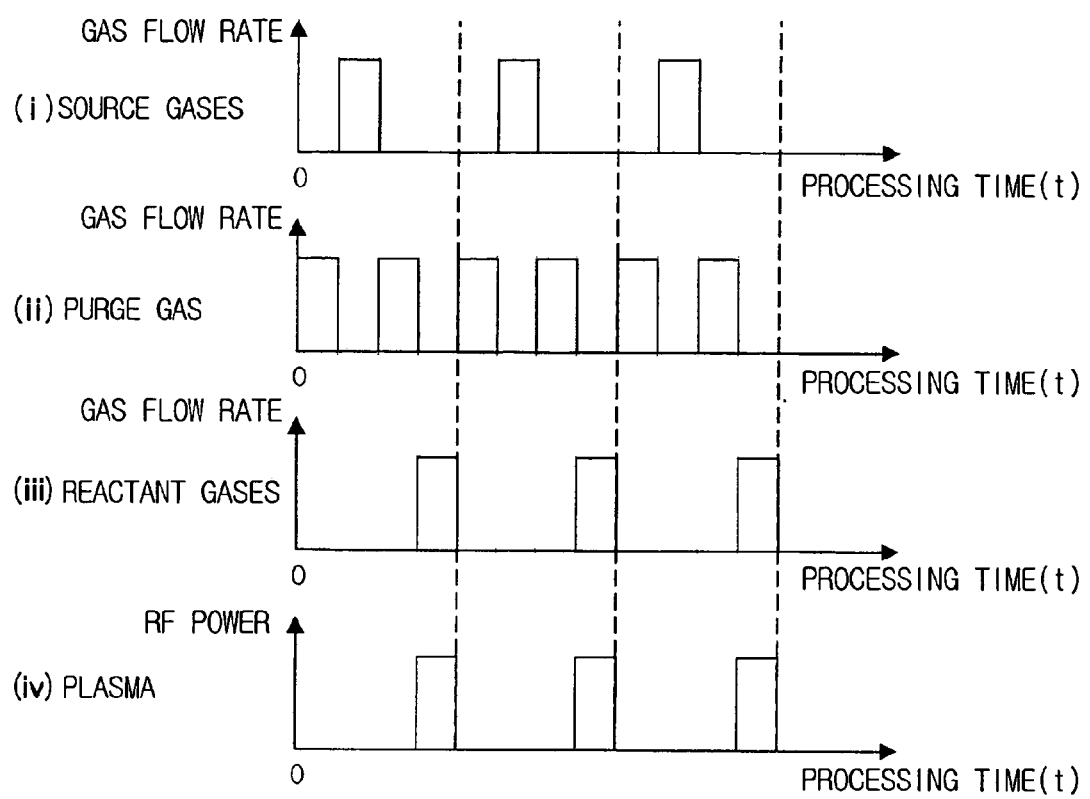
FIG. 2B is a graph showing a process of sequentially supplying the process gases and radicals of reactant gases by generating plasma within a showerhead of the chemical vapor deposition apparatus shown in FIG. 2A.

FIG. 2B shows a graph diagrammatically illustrating the sequential supply of the process gases consisting of the processes of injecting and purging the source gases, injecting the radicals of the reactant gases, and purging the reactant gases while generating the plasma within the showerhead of the chemical vapor deposition apparatus shown in FIG. 2A.

Inert gas atmosphere is first created in the showerhead and the chamber by injecting the purge gas through the showerhead for a predetermined period of time, as shown in FIG. 2B (ii). Then, the source gases are injected for a predetermined period of time to be adsorbed on the wafer or substrate, as shown in FIG. 2B (i). Subsequently, the source gases remaining in the showerhead and the chamber are purged and discharged by using the purge gas for the predetermined period of time, as shown in FIG. 2B (ii). Thereafter, as shown in FIGS. 2b (c) and (d), the reactant gases are introduced into the showerhead for a predetermined period of time, and at the same time, the plasma is generated within the showerhead so that the radicals of the reactant gases are injected onto the wafer or substrate. After the thin film having a predetermined thickness is formed on the wafer or substrate by injecting the radicals of the reactant gases for the predetermined period of time in such a manner, the injection of the reactant gases and the electric power supplied from the RF power source to the RF electrode plate are cut off to extinguish the plasma. Then, the reactant gases and reaction byproduct gases remaining in the showerhead and the chamber are purged and discharged by using the purge gas. Accordingly, the thin film having the predetermined thickness is formed on the wafer or substrate by repeating such processes.

Figure 2C:
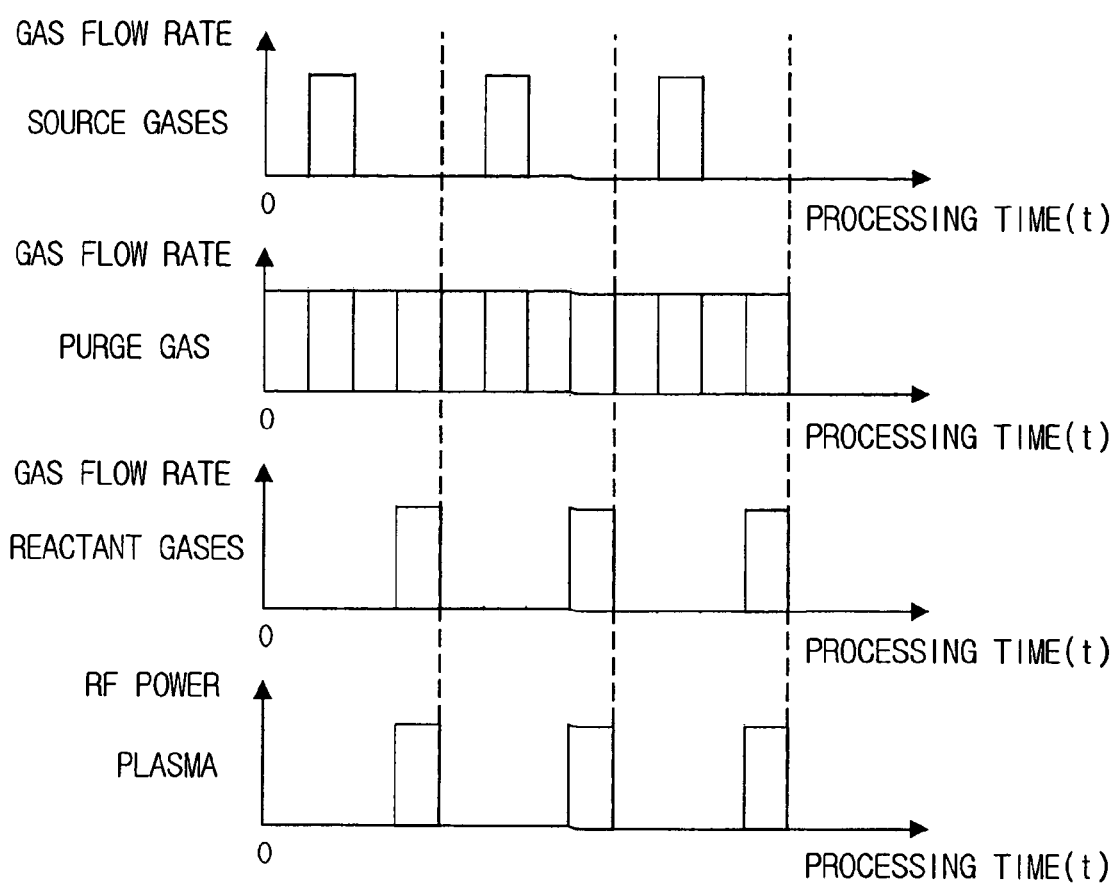
FIG. 2C is a graph showing a process of sequentially supplying the process gases and the radicals by generating the plasma within the showerhead of the chemical vapor deposition apparatus shown in FIG. 2A, in a state where a purge gas is always supplied.

FIG. 2C is a graph showing a process of preventing mixing of the source gases with the reactant gases within the showerhead and the chamber by sequentially supplying only the source and reactant gases while continuously supplying the purge gas during sequential supply of the process gases and generating the plasma within the showerhead of the chemical vapor deposition apparatus shown in FIG. 2A.

When the purge gas is continuously supplied and only the source and reactant gases are sequentially supplied as shown in FIG. 2C, it is possible to minimize a variation in pressure of the chamber so that reproducibility of the processes can be improved.

Second Embodiment

Figure 3A:
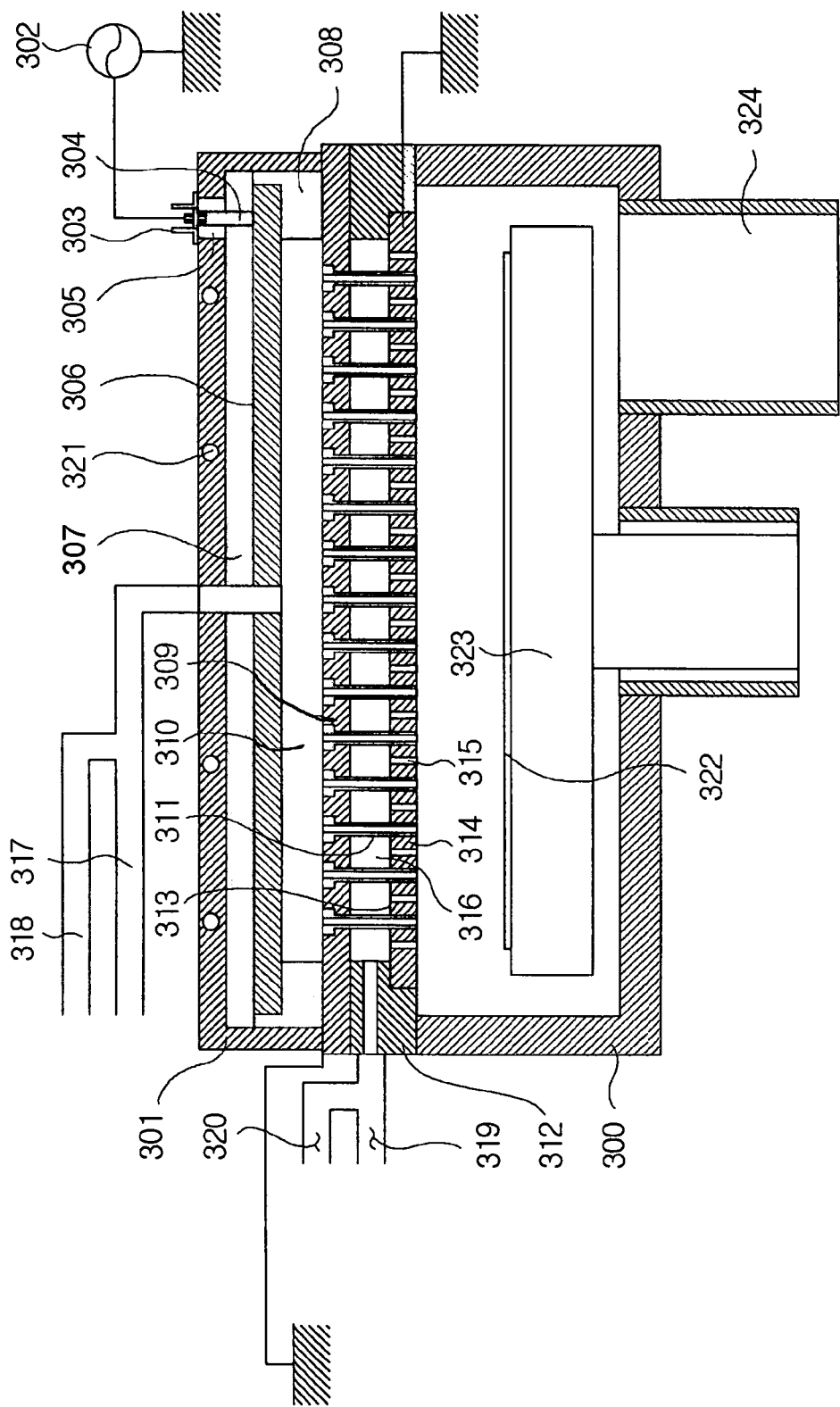
FIG. 3A is a schematic view showing constitutional elements of a radical assisted chemical vapor deposition apparatus in which the process gases are sequentially supplied and the plasma is generated in an upper portion of a showerhead partitioned at a predetermined interval according to a second embodiment of the present invention.

FIG. 3A is a schematic view showing constitutional elements of a radical assisted chemical vapor deposition apparatus in which the process gases are sequentially supplied and the plasma is generated in an upper portion of a showerhead partitioned into a predetermined pattern according to a second embodiment of the present invention.

As can be seen from this figure, the chemical vapor deposition apparatus of the present invention is constructed such that a thin film is formed by sequentially supplying the process gases using the processes of injecting and purging the source gases and injecting and purging the reactant gases; that mixing of the source gases with the reactant gases is completely prevented within the showerhead by partitioning the showerhead into two sections to separate a first section where the source gases are introduced and injected from a second section where the reactant gases are introduced and injected; and that upon injection of the reactant gases, the radicals of the reactant gases can be injected by generating the plasma within a section of the showerhead into which the reactant gases are introduced and injected.

As shown in FIG. 3A, in the chemical vapor deposition apparatus of the present invention, an upper plate 301 is mounted on the top of a chamber 300 for constituting a portion of the chamber 300, and an RF power source connection portion 303 which can be connected to an external RF power source 302 is installed on a side of the upper plate 301. The RF power source connection portion 303 is connected to an RF rod 304, and the RF rod 304 is electrically insulated from the upper plate 301 by means of an RF rod insulation portion 305 formed around the RF rod 304.

The RF rod 304 is connected to an RF electrode plate 306 installed on an inner side of the upper plate 301, and the plasma is generated within the showerhead by means of such RF electrode plate 306. At this time, in order to electrically insulate the RF electrode plate 306, an upper insulation portion 307 is installed above the RF electrode plate 306, i.e., between the RF electrode plate 306 and the upper plate 301. Further, a lower insulation portion 308 is installed on the bottom of the RF electrode plate 306 in such a manner that a first buffer portion 310 is defined with a predetermined gap between the RF electrode plate 306 and a first showerhead 309 disposed below the RF electrode plate 306 by means of the lower insulation portion 308. That is, the lower insulation portion 308 causes the RF electrode plate 306 to be insulated from an inner surface of the upper plate 301 and simultaneously to be spaced apart from the first showerhead 309 disposed below the RF electrode plate 306 with the predetermined gap.

The first showerhead 309 is installed below the buffer portion having the predetermined gap defined by the lower insulation portion 308, and is formed with a plurality of radical injection tubes 311 for uniformly injecting the radicals of the reactant gases. Further, the first showerhead 309 is electrically grounded through connection with the upper plate 301.

In the chemical vapor deposition apparatus of the present invention constructed as such, the plasma is generated in the first buffer portion 310 having the predetermined gap defined by the RF electrode plate 306 installed on the upper plate 301, the lower insulation portion 308 and the first showerhead 309.

Moreover, a lower plate 312 having a predetermined height, which constitutes a portion of the chamber 300, is mounted on the bottom of the first showerhead 309. A second showerhead 313 is installed on a lower side of the lower plate 312. That is, the first and second showerheads 309, 313 are disposed to vertically face each other with a predetermined gap therebetween by means of the lower plate 312. The second showerhead 313 thus disposed is formed with a plurality of through-holes 314 through which the plurality of radical injection tubes 311 formed in the first showerhead 309 penetrate and a plurality of source gas injection holes 315 for uniformly injecting the source gases. When the first and second showerheads 309, 313 constructed as such are disposed in places by fitting the radical injection tubes 311 of the first showerhead 309 into the through-holes 314 of the second showerhead 313 and forming the predetermined gap between the first and second showerheads 309, 313, a second buffer portion 316 is defined.

Further, on an outer side of the upper plate 301 are installed at least one reactant gas introduction tube 317 and a first purge gas introduction tube 318 to penetrate through the upper plate 301. The reactant gases and the purge gas are supplied to the first buffer portion 310 through the reactant gas introduction tube 317 and the first purge gas introduction tube 318. In addition, on an outer side of the lower plate 312 are installed at least one source gas introduction tube 319 and a second purge gas introduction tube 320 to penetrate through the lower plate 312. The source gases and the purge gas are supplied to the second buffer portion 316 through the source gas introduction tube 319 and the second purge gas introduction tube 320.

A heater 323 supports a wafer or substrate 322 (hereinafter, referred to as "substrate") on which a thin film is actually formed and simultaneously supplies the substrate with predetermined thermal energy, within the chamber 300 which is disposed below the lower plate 312 and in which the supplied process gases react with one another. Further, another heater 321 for maintaining the upper plate 301 at a constant temperature is embedded in the upper plate 301. That is, the temperature around the top of the chamber 300 can be kept constant by means of the heater 321.

Figure 3B:
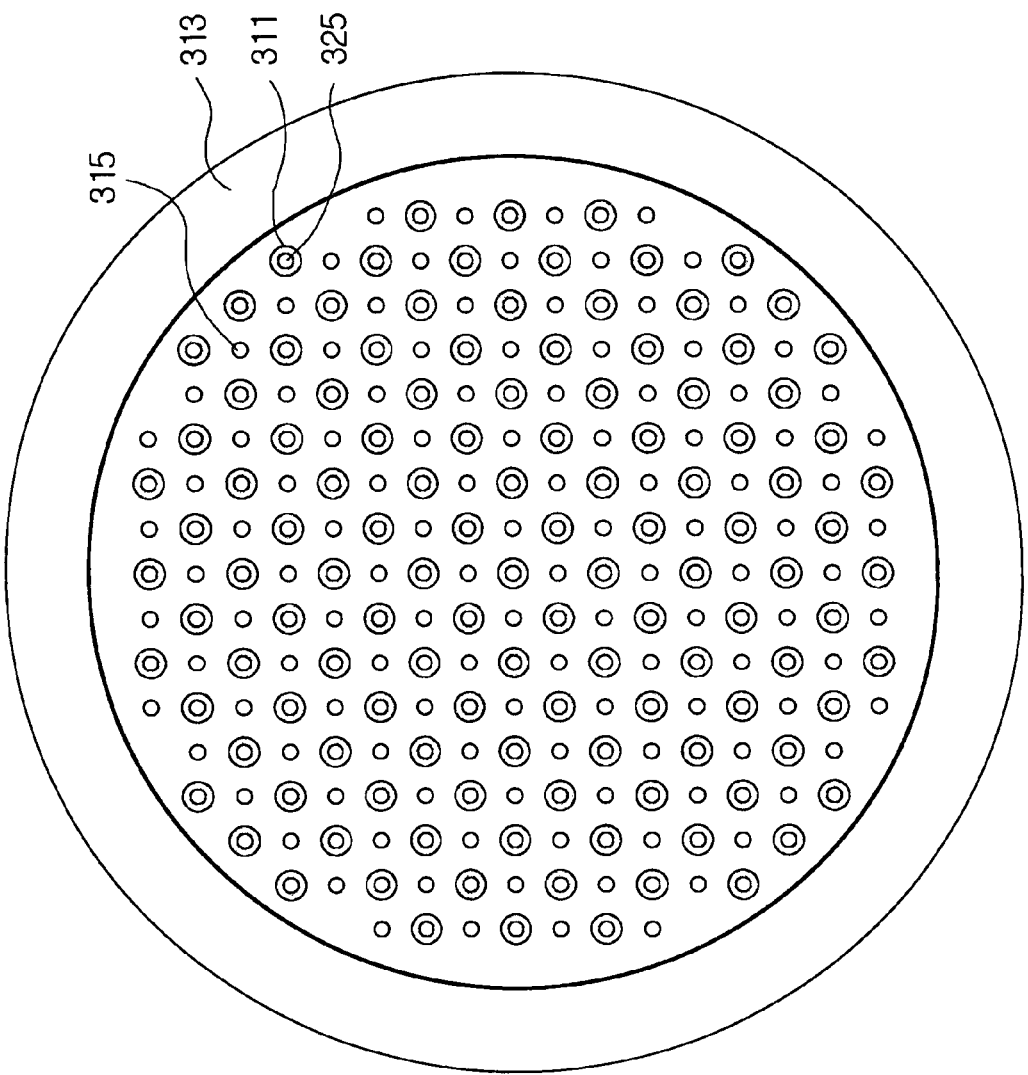
FIG. 3B is a rear view showing a rear face of the showerhead which is an essential portion of the chemical vapor deposition apparatus shown in FIG. 3A.

FIG. 3B is a rear view showing a rear face of the showerhead which is an essential portion of the chemical vapor deposition apparatus shown in FIG. 3A. Holes 325 of the plurality of radical injection tubes 311 and the source gas injection holes 315 are arranged in a grid pattern on the rear face of the second showerhead 313.

Hereinafter, a process of forming the thin film on the substrate by using the chemical vapor deposition apparatus of the present invention constructed as mentioned above will be described in detail.

The source gases are introduced into the second buffer portion 316 for a predetermined period of time through the source gas introduction tube 319 installed on the lower plate 312 and are injected through the source gas injection holes 315 formed in the second showerhead 313 so that the source gases are adsorbed on the substrate 322. After such injection of the source gases for the predetermined period of time, the source gases remaining in the second showerhead 313 and the chamber 300 are purged and discharged for a predetermined period of time through an outlet 324 installed on a side of the chamber 300 by using the purge gas which is introduced through the second purge gas introduction tube 320. After discharging the remaining source gases in such a way, the reactant gases are supplied to the first buffer portion 310 for a predetermined period of time through the reactant gas introduction tube 317 installed on the upper plate 301 and are injected through the radical injection tubes 311 formed in the first showerhead 309 onto the substrate 322 so as to induce reactions of the injected reactant gases with the source gases adsorbed on the substrate 322 and to form the thin film on the substrate 322. At this time, the reaction of the injected reactant gases with the source gases adsorbed on the substrate 322 is further activated by applying electric power from the RF power source 302 to the RF electrode plate 306 to generate the plasma within the first buffer portion 310 and injecting the radicals of the reactant gases through the radical injection tubes 311 fitted into the through-holes 314 of the second showerhead 313.

After injecting the radicals of the reactant gases for the predetermined period of time, the reactant gases remaining in the first showerhead 309 and the chamber 300 are purged and discharged for a predetermined period of time by using the purge gas which is introduced through the first purge gas introduction tube 318. Thus, the present invention allows formation of the thin film having the predetermined thickness on the wafer or substrate by separately introducing the source gases and the reactant gases and by repeating the sequential supply of the process gases consisting of the processes of injecting and purging the source gases, injecting the radicals of the reactant gases, and purging the reactant gases.

In such a way, the chemical vapor deposition apparatus of the present invention can ensure a faster deposition rate and form a thin film having excellent step coverage and film quality characteristics on the wafer or substrate by further activating the reaction of the reactant gases with the source gases adsorbed on the wafer or substrate by means of the radicals of the reactant gases injected through the radical injection tubes 311. Moreover, according to the chemical vapor deposition apparatus of the present invention, since the plasma is separated from the second showerhead 313 through which the source gases are injected, it is possible to thoroughly prevent the source gases, which have not been completely removed even by the purging process using the purge gas, from reacting with the plasma of the reactant gases within the showerhead and thus to avoid generation of particles and deterioration of the step coverage. Furthermore, according to the chemical vapor deposition apparatus of the present invention, since the chamber and the wafer or substrate are not directly exposed to the plasma, it is possible to prevent any physical damages to the wafer or substrate and circuit elements formed thereon due to arc which may be produced during generation of the plasma, ion bombarding and ion implant.

Third Embodiment

Figure 4:
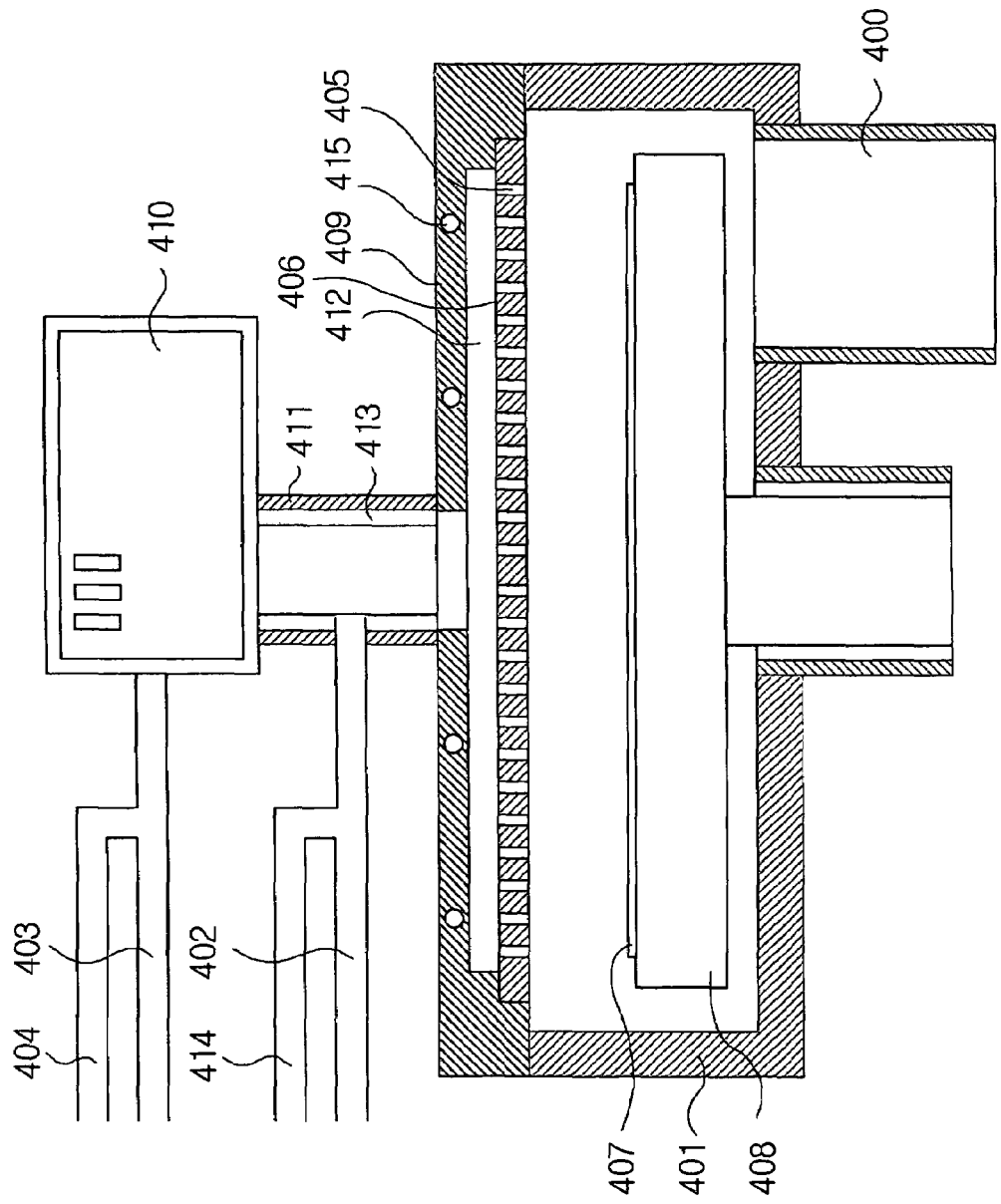
FIG. 4 is a schematic view showing constitutional elements of a chemical vapor deposition apparatus in which the process gases are sequentially supplied and the external plasma generating apparatus is employed according to a third embodiment of the present invention.

FIG. 4 is a schematic view showing constitutional elements of a chemical vapor deposition apparatus in which the process gases are sequentially supplied and an external plasma generating apparatus is employed according to a third embodiment of the present invention.

As shown in this figure, the chemical vapor deposition apparatus of the present invention comprises a chamber 401 with an outlet 400 disposed at a lower portion thereof, a showerhead 406 with a plurality of injection holes 405 formed therein for injecting the process gases, and a heater 408 for supporting a wafer or substrate 407 (hereinafter, referred to as "substrate") on which a thin film is deposited with the process gases injected through the showerhead 406 and for simultaneously functioning as a heat source.

An upper plate 409 is mounted on the top of the chamber 401 for constituting a portion of the chamber 401. An external plasma generating apparatus 410 is connected with the chamber 401 to communicate with each other on an outer side of the upper plate 409. At least one reactant gas introduction tube 403 and at least one purge gas introduction tube (second purge gas introduction tube) 404 are installed on a side of the external plasma generating apparatus 410 to penetrate into the external plasma generating apparatus 410, so that the plasma and radicals of the reactant gases can be generated upon creation of the plasma within the external plasma generating apparatus 410.

The plasma and radicals generated in the external plasma generating apparatus 410 are introduced, through a plasma guide tube 411 formed to penetrate into a portion of the upper plate 409, into a buffer portion 412 defined with a predetermined gap between the upper plate 409 and the showerhead 406. At this time, since the plasma and radicals generated in the external plasma generating apparatus 410 are extinguished due to a phenomenon of recombination when they collide against a conductor, an insulation portion 413 should be installed in the plasma guide tube 411 to prevent the plasma and radicals from being extinguished until they reach the buffer portion 412.

Further, at least one source gas introduction tube 402 and at least one purge gas introduction tube (first purge gas introduction tube) 414 communicate with a portion on a side of the plasma guide tube 411. In addition, a heater 415 for keeping the upper plate 409 at a constant temperature is embedded in the upper plate 409. The temperature around the top of the chamber 401 can be kept constant by means of the heater 415.

That is, the chemical vapor deposition apparatus of the present invention allows formation of the thin film having a predetermined thickness on the wafer or substrate using the process gases supplied through the introduction tubes and the external plasma generating apparatus by supplying the process gases in sequential processes of injecting and purging the source gases, injecting the radicals of the reactant gases, and purging the reactant gases.

Hereinafter, a process of forming the thin film on the substrate by using the chemical vapor deposition apparatus of the present invention constructed as mentioned above will be described in detail.

Inert gas atmosphere is first created in the showerhead 406 and the chamber 401 by introducing the purge gas through the second purge gas introduction tube 404 installed on the side of the external plasma generating apparatus 410, the buffer portion 412 defined with the predetermined gap within the upper plate 409, and the showerhead 406 disposed below the buffer portion 412 for a predetermined period of time. Then, the source gases are introduced through the source gas introduction tube 402, which is installed at the portion on the side of the plasma guide tube 411 to penetrate thereinto, for a predetermined period of time to be adsorbed on the substrate 407. Subsequently, the source gases remaining in the showerhead 406 and the chamber 401 are purged and discharged by supplying the purge gas through the first purge gas introduction tube 414, which is installed at the portion on the side of the plasma guide tube 414 to penetrate thereinto, for a predetermined period of time.

Then, the reactant gases are introduced, through the reactant gas introduction tube 403 installed on the side of the external plasma generating apparatus 410, into the external plasma generating apparatus 410 for a predetermined period of time. At the same time, plasma is generated within the external plasma generating apparatus 410, so that the plasma of the reactant gases is introduced into the buffer portion 412 through the plasma guide tube 411 and the radicals of the reactant gases are injected through the showerhead 406 onto the substrate 407 for a predetermined period of time. After forming the thin film having a predetermined thickness on the substrate 407 by injecting the radicals of the reactant gases for the predetermined period of time in such a way, introduction of the reactant gases is cut off and the plasma in the external plasma generating apparatus 410 is extinguished. Then, the reactant gases and reaction byproduct gases remaining in the showerhead 406 and the chamber 401 are purged and discharged by introducing the purge gas through the second purge gas introduction tube 404. Accordingly, the thin film having a predetermined thickness is formed on the wafer or substrate by repeating such processes.

Fourth Embodiment

Figure 5:
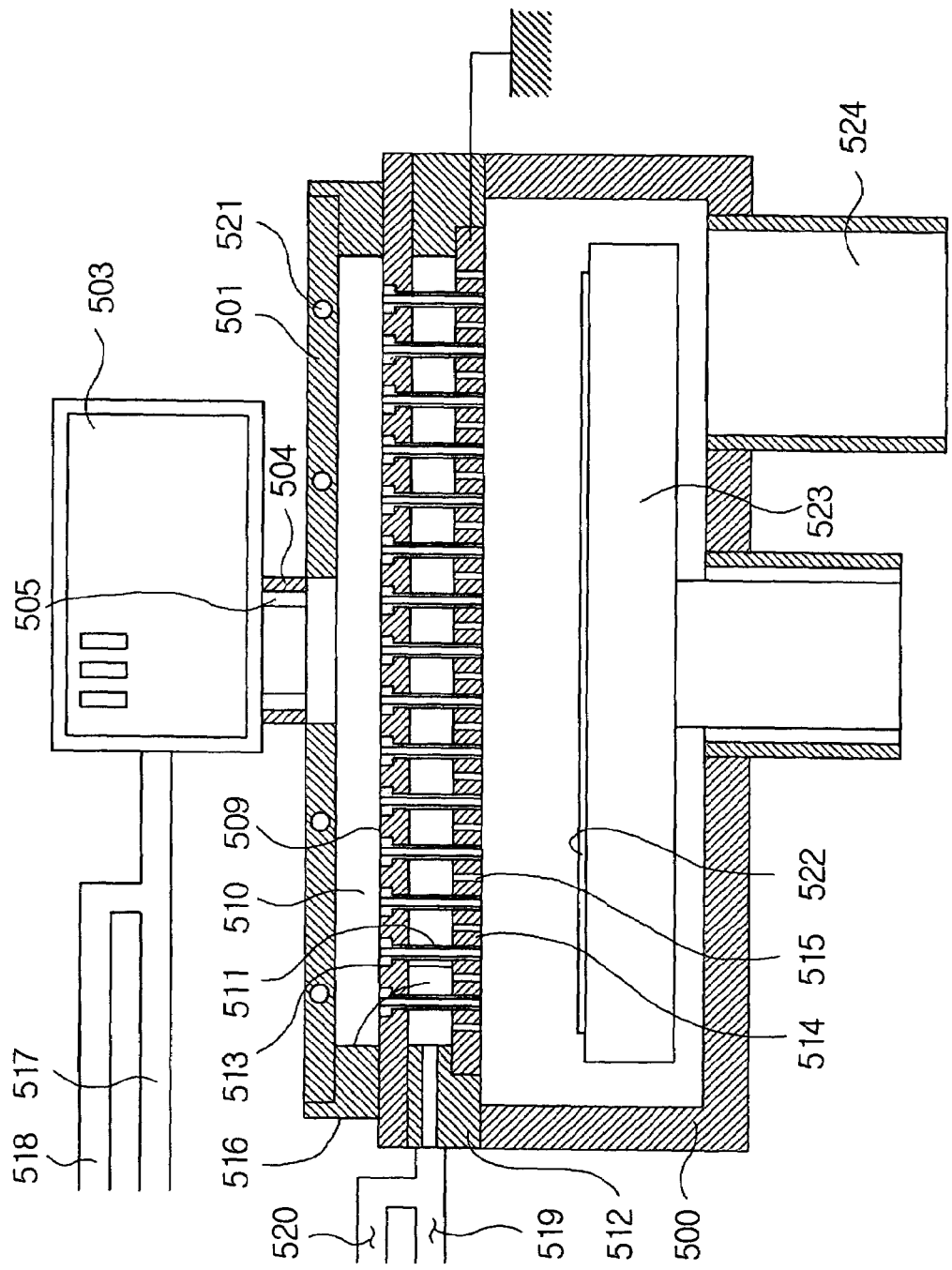
FIG. 5 is a schematic view showing constitutional elements of a radical assisted chemical vapor deposition apparatus in which the process gases are sequentially supplied and the external plasma generating apparatus is employed so that the plasma is introduced into the upper portion of the showerhead partitioned at the predetermined interval according to a fourth embodiment of the present invention.

FIG. 5 is a schematic view showing constitutional elements of a radical assisted chemical vapor deposition apparatus in which the process gases are supplied in a sequential manner and the external plasma generating apparatus is employed so that the plasma is introduced into an upper portion of the showerhead partitioned into a predetermined shape according to a fourth embodiment of the present invention.

As shown in this figure, in the chemical vapor deposition apparatus of the present invention, an upper plate 501 is mounted on the top of a chamber 500 to constitute a portion of the chamber 500. An external plasma generating apparatus 503 is connected with the chamber 500 to communicate with each other on an outer side of the upper plate 501. At least one reactant gas introduction tube 517 and a first purge gas introduction tube 518 are installed on a side of the external plasma generating apparatus 503 to penetrate thereinto, so that the plasma and radicals of the reactant gases can be generated upon creation of the plasma within the external plasma generating apparatus 503.

The plasma and radicals generated in the external plasma generating apparatus 503 are introduced, through a plasma guide tube 504 formed to penetrate into a portion of the upper plate 501, into a buffer portion 510 defined with a predetermined gap between the upper plate 501 and a first showerhead 509. At this time, since the plasma and radicals generated in the external plasma generating apparatus 503 collide against a conductor and is then extinguished due to the phenomenon of recombination, an insulation portion 505 is installed in the plasma guide tube 504 to prevent the plasma and radical from being extinguished until they reach the first buffer portion 510.

The first showerhead 509 is installed below the first buffer portion 510, and is formed with a plurality of radical injection tubes 511 for uniformly injecting the radicals of the reactant gases.

Moreover, a lower plate 512 having a predetermined height, which constitutes a portion of the chamber 500, is mounted on the bottom of the first showerhead 509. A second showerhead 513 is installed on a lower side of the lower plate 512. That is, the first and second showerheads 509, 513 are disposed to vertically face each other with a predetermined gap therebetween by means of the lower plate 512. The second showerhead 513 thus disposed is formed with a plurality of through-holes 514 through which the plurality of radical injection tubes 511 formed in the first showerhead 509 pass. Also, there are formed a plurality of source gas injection holes 515 for uniformly injecting the source gases. When the first and second showerheads 509, 513 constructed as such are disposed in places by fitting the radical injection tubes 511 of the first showerhead 509 into the through-holes 514 of the second showerhead 513 and forming the predetermined gap between the first and second showerheads 509, 513, a second buffer portion 516 is defined. Further, the second showerhead 513 is electrically grounded through connection with the lower plate 512.

Further, on an outer side of the lower plate 512 are installed at least one source gas introduction tube 519 and a second purge gas introduction tube 520 to penetrate through the lower plate 512. The source gases and the purge gas are introduced into the second buffer portion 516 through the source gas introduction tube 519 and the second purge gas introduction tube 520.

A heater 523 supports a wafer or substrate 522 (hereinafter, referred to as "substrate") on which a thin film is actually formed. The heater also supplies the substrate with predetermined thermal energy, within the chamber 500 which is disposed below the lower plate 512 and where the supplied process gases react with one another. Further, another heater 521 for keeping the upper plate 501 at a constant temperature is embedded in the upper plate 501. That is, the temperature around the top of the chamber 500 can be kept constant by means of the heater 521.

Hereinafter, a process of forming the thin film on the substrate by using the chemical vapor deposition apparatus of the present invention constructed as mentioned above will be described in detail.

The source gases are introduced into the second buffer portion 516 for a predetermined period of time through the source gas introduction tube 519 installed on the lower plate 512 and are injected through the source gas injection holes 515 formed in the second showerhead 513 so that the source gases are adsorbed on the substrate 522. After such injection of the source gases for the predetermined period of time, the source gases remaining in the second showerhead 513 and the chamber 500 are purged and discharged for a predetermined period of time through an outlet 524 installed on a side of the chamber 500 by using the purge gas which is introduced through the second purge gas introduction tube 520.

Then, the reactant gases are introduced, through the reactant gas introduction tube 517 installed on the side of the external plasma generating apparatus 503, into the external plasma generating apparatus 503 for a predetermined period of time. At the same time, plasma is generated within the external plasma generating apparatus 503, and the plasma of the reactant gases is introduced into the first buffer portion 510 through the plasma guide tube 504 and the radicals of the reactant gases are injected through the radical injection tubes 511 of the first showerhead 509 onto the substrate 522 for a predetermined period of time.

After injecting the radicals of the reactant gases in such a way, the reactant gases remaining in the first showerhead 509 and the chamber 500 are purged and discharged for a predetermined period of time by using the purge gas being introduced through the first purge gas introduction tube 518. Thus, the present invention allows formation of the thin film having the predetermined thickness on the wafer or substrate by separately introducing the source gases and the reactant gases and by repeating the sequential supply of the process gases consisting of the processes of injecting and purging the source gases, injecting the radicals of the reactant gases, and purging the reactant gases.

Fifth Embodiment

Figure 6A:
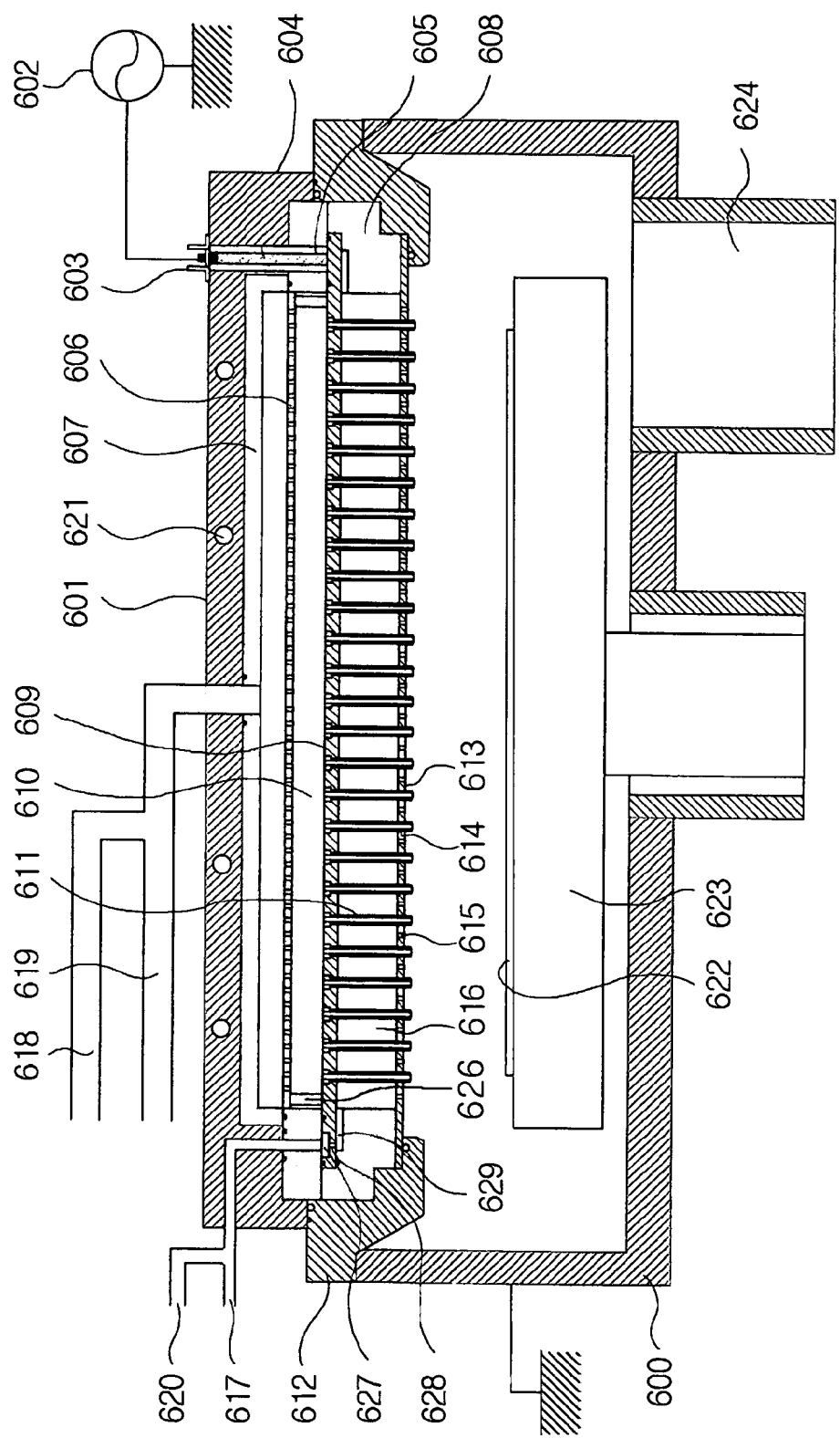
FIG. 6A is a schematic view showing constitutional elements of a radical assisted chemical vapor deposition apparatus in which the process gases are sequentially supplied and the plasma is generated in a lower portion of the showerhead partitioned at the predetermined interval according to a fifth embodiment of the present invention.

FIG. 6A is a schematic view showing constitutional elements of a radical assisted chemical vapor deposition apparatus in which the process gases are sequentially supplied and the plasma is generated in a lower portion of the showerhead partitioned at the predetermined interval according to a fifth embodiment of the present invention.

As shown in this figure, in the chemical vapor deposition apparatus of the present invention, an upper plate 601 is mounted on the top of a chamber 600 to constitute a portion of the chamber 600, and an RF power source connection portion 603 which can be connected to an external RF power source 602 is installed on a side of the upper plate 601. The RF power source connection portion 603 is connected to an RF rod 604, and the RF rod 604 is electrically insulated from the upper plate 601 by means of an RF rod insulation portion 605 formed around the RF rod 604.

The RF rod 604 is connected to a first showerhead 609 installed on an inner side of the upper plate 601. At this time, in order to electrically insulate the first showerhead 609 from the upper plate 601, an upper insulation portion 607 is installed with a predetermined gap above the first showerhead 609 so as to make a close contact with an inner surface of the upper plate 601. With the first showerhead 609 and the upper insulation portion 607 thus disposed, a first buffer portion 610 having the predetermined gap is defined.

Further, a lower insulation portion 608 having a predetermined height, which constitutes a portion of the chamber 600, is installed on the bottom of the first showerhead 609. A lower plate 612 is mounted on an outer side of the lower insulation portion 608. Then, a second showerhead 613 is installed below the lower insulation portion 608 and the lower plate 612 so that the first and second showerheads 609, 613 are disposed to face each other with a predetermined gap therebetween. In such a way, a second buffer portion 616 having a predetermined gap is defined by the first and second showerheads 609, 613. At this time, the second showerhead 613 is electrically grounded through connection with the lower plate 612.

In the chemical vapor deposition apparatus of the present invention constructed as such, plasma is generated in the second buffer portion 616 having the predetermined gap, which is defined by the first showerhead 609, the lower insulation portion 608 and the second showerhead 613.

An intermediate plate 606 with a plurality of injection holes for uniformly distributing the introduced source gases are formed is installed in the first buffer portion 610. The intermediate plate 606 is fixed to the first showerhead 609 by means of support pins 626 disposed below the intermediate plate 606. Further, the first showerhead 609 is formed with a plurality of source gas injection tubes 611 for uniformly injecting the source gases.

The second showerhead 613 is formed with a plurality of through-holes 614 through which the plurality of source gas injection tubes 611 formed in the first showerhead 609 pass. There are also formed a plurality of radical injection holes 615 for uniformly injecting the radicals of the reactant gases generated by the plasma in the second buffer portion 616. When the first and second showerheads 609, 613 constructed as such are disposed in places by fitting the source gas injection tubes 611 of the first showerhead 609 into the through-holes 614 of the second showerhead 613 and forming the predetermined gap between the first and second showerheads 609, 613, the second buffer portion 616 is defined.

Further, on an outer side of the upper plate 601 are installed at least one source gas introduction tube 619 and a first purge gas introduction tube 618 pass through the upper plate 601. The source gases and the purge gas are supplied to the first buffer portion 610 through the source gas introduction tube 619 and the first purge gas introduction tube 618. In addition, on another outer side of the upper plate 601 are installed at least one reactant gas introduction tube 617 and a second purge gas introduction tube 620 to penetrate through the upper plate 601. The reactant gases and the purge gas, which have been introduced through the reactant gas introduction tube 617 and the second purge gas introduction tube 620 thus installed, are uniformly distributed through a circular reactant gas buffer portion 627 formed in the first showerhead 609 and then introduced through a reactant gas distribution hole 628 toward a reactant gas inlet 629. The reactant gases and the purge gas, which have been introduced through the reactant gas inlet 629, flow into the second buffer portion 616.

A heater 623 supports a wafer or substrate 622 (hereinafter, referred to as "substrate") on which a thin film is actually formed. Also, it supplies the substrate with predetermined thermal energy, within the chamber 600 which is disposed below the lower plate 612 and where the supplied process gases react with one another. Further, another heater 621 for keeping the upper plate 601 at a constant temperature is embedded in the upper plate 601. That is, the temperature around the top of the chamber 600 can be kept constant by means of the heater 621.

Figure 6B:
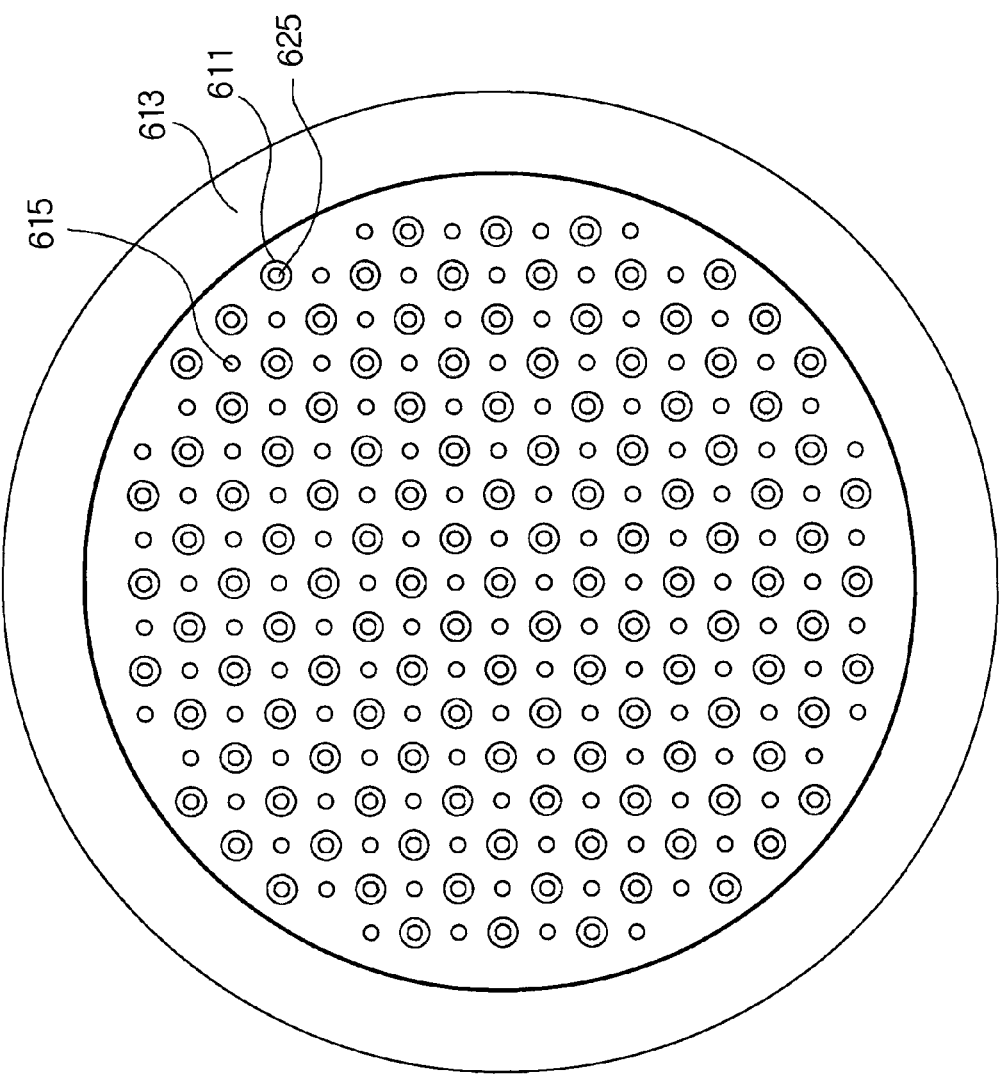
FIG. 6B is a rear view showing a rear face of the showerhead which is an essential portion of the chemical vapor deposition apparatus shown in FIG. 6A.

FIG. 6B is a rear view showing a rear face of the showerhead which is an essential portion of the chemical vapor deposition apparatus shown in FIG. 6A. Holes 6325 of the plurality of source gas injection tubes 611 and the radical injection holes 615 are arranged in a grid pattern on the rear face of the second showerhead 613.

Hereinafter, a process of forming the thin film on the substrate by using the chemical vapor deposition apparatus of the present invention constructed as mentioned above will be described in detail.

The source gases are introduced into the first buffer portion 610 for a predetermined period of time through the source gas introduction tube 619 installed on the upper plate 601 and are injected through the source gas injection tubes holes 611 formed in the first showerhead 609 so that the source gases are adsorbed on the substrate 622. After such injection of the source gases for the predetermined period of time, the source gases remaining in the first showerhead 609 and the chamber 600 are purged and discharged for a predetermined period of time through an outlet 624 installed on a side of the chamber 600 by using the purge gas which is introduced through the first purge gas introduction tube 618. After discharging the remaining source gases in such a way, the reactant gases are supplied to the second buffer portion 616 for a predetermined period of time through the reactant gas introduction tube 617 installed on the upper plate 601 and are injected through the radical injection holes 615 formed in the second showerhead 613 onto the substrate 622 so as to induce reactions of the reactant gases with the source gases adsorbed on the substrate 622 and to form the thin film on the substrate 622. At this time, the reactions of the reactant gases with the source gases adsorbed on the wafer or substrate are further activated by applying electric power from the RF power source 602 to the first showerhead 609 to generate the plasma within the second buffer portion 616 and injecting the radicals of the reactant gases through the radical injection holes 615 of the second showerhead 613.

After injecting the radicals of the reactant gases for the predetermined period of time, the reactant gases and reaction byproduct gases remaining in the second showerhead 613 and the chamber 600 are purged and discharged for a predetermined period of time by using the purge gas which is introduced through the second purge gas introduction tube 620. Thus, the present invention allows formation of the thin film having the predetermined thickness on the wafer or substrate by separately introducing the source gases and the reactant gases and by repeating the sequential supply of the process gases consisting of the processes of injecting and purging the source gases, injecting the radicals of the reactant gases, and purging the reactant gases.

Hereinafter, the sequential supply of the process gases and the radicals in the chemical vapor deposition apparatuses according to the second to fifth embodiments of the present invention constructed as described above will be explained in detail.

Figure 7:
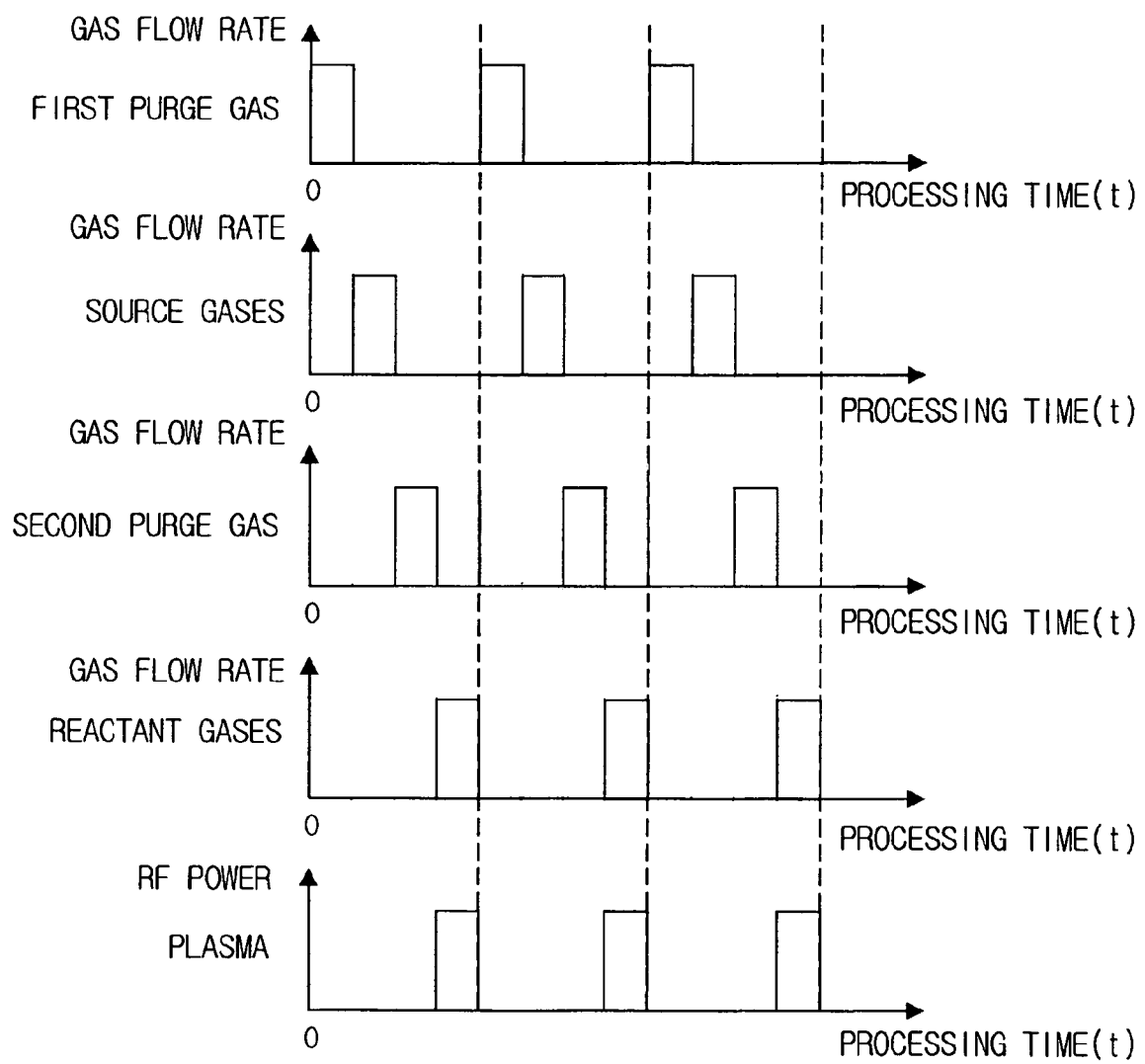
FIGS. 7 and 8 are graphs showing processes of sequentially supplying the process gases and the radicals of the reactant gases in the chemical vapor deposition apparatus according to the present invention.
Figure 8:
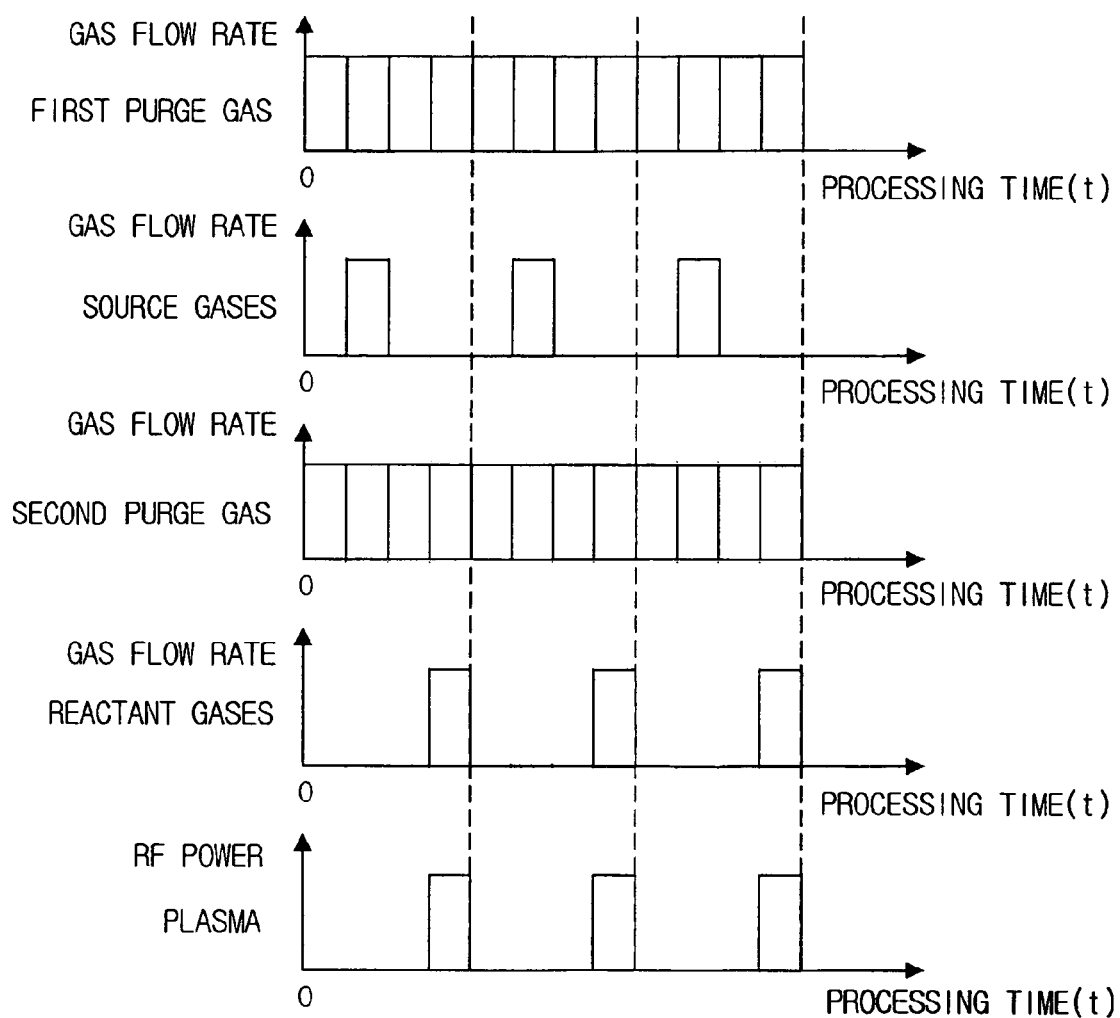

FIGS. 7 and 8 are graphs diagrammatically illustrating the sequential supply of the process gases consisting of the processes of injecting and purging the source gases, injecting the radicals of the reactant gases, and purging the reactant gases in the chemical vapor deposition apparatus according to the present invention.

As shown in FIG. 7, the purge gas is injected through the first and second showerheads for the predetermined period of time to create the inert gas atmosphere within the showerhead and the chamber, and then, the source gases are injected for the predetermined period of time to cause the source gases to be adsorbed on the wafer or the substrate. Thereafter, the source gases remaining in the showerhead and the chamber are purged and discharged for the predetermined period of time by using the purge gas, and the reactant gases are then introduced into the showerhead for the predetermined period of time, and at the same time, the plasma is generated in the showerhead so as to inject the radicals of the reactant gases onto the wafer or substrate.

After the thin film having the predetermined thickness is formed on the wafer or substrate by injecting the radicals of the reactant gases for the predetermined period of time, the introduction of the reactant gases and the electric power from the RF power source (or power source for the external plasma generating apparatus) are cut off to extinguish the plasma.

Then, the reactant gases and reaction byproduct gases remaining in the showerhead and the chamber are purged and discharged by using the purge gas. By repeating such processes, the thin film having the predetermined thickness is formed on the wafer or the substrate. At this time, as shown in FIG. 8, it is possible to minimize time needed for purging the source gases and the reactant gases by continuously introducing the first and second purge gases. In addition, the reproducibility of the processes can be ensured by minimizing variations in the pressure of the chamber.

Figure 9:
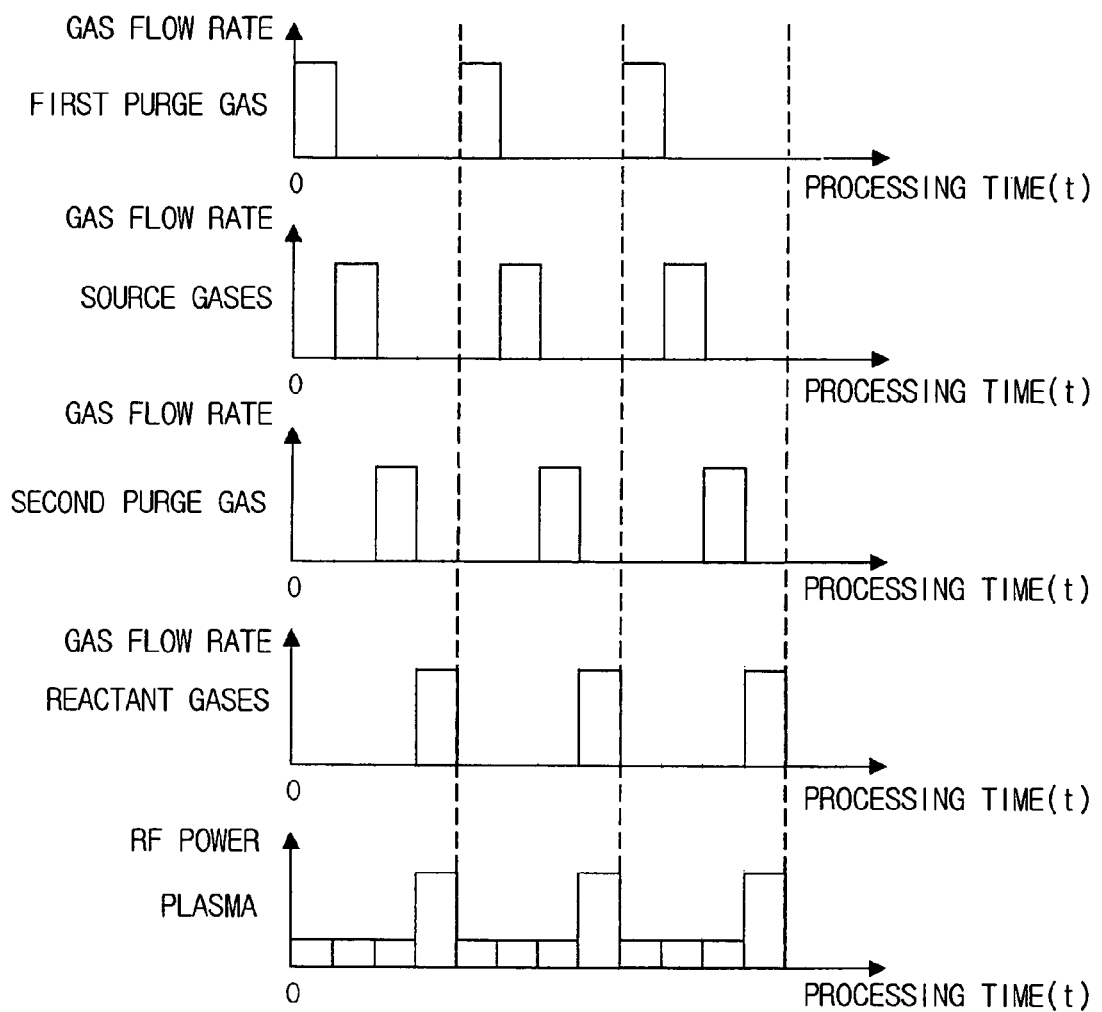
FIGS. 9 and 10 are graphs showing a process of sequentially supplying the process gases and the radicals of the reactant gases while maintaining a more stable state of the plasma in the chemical vapor deposition apparatus according to the present invention.
Figure 10:
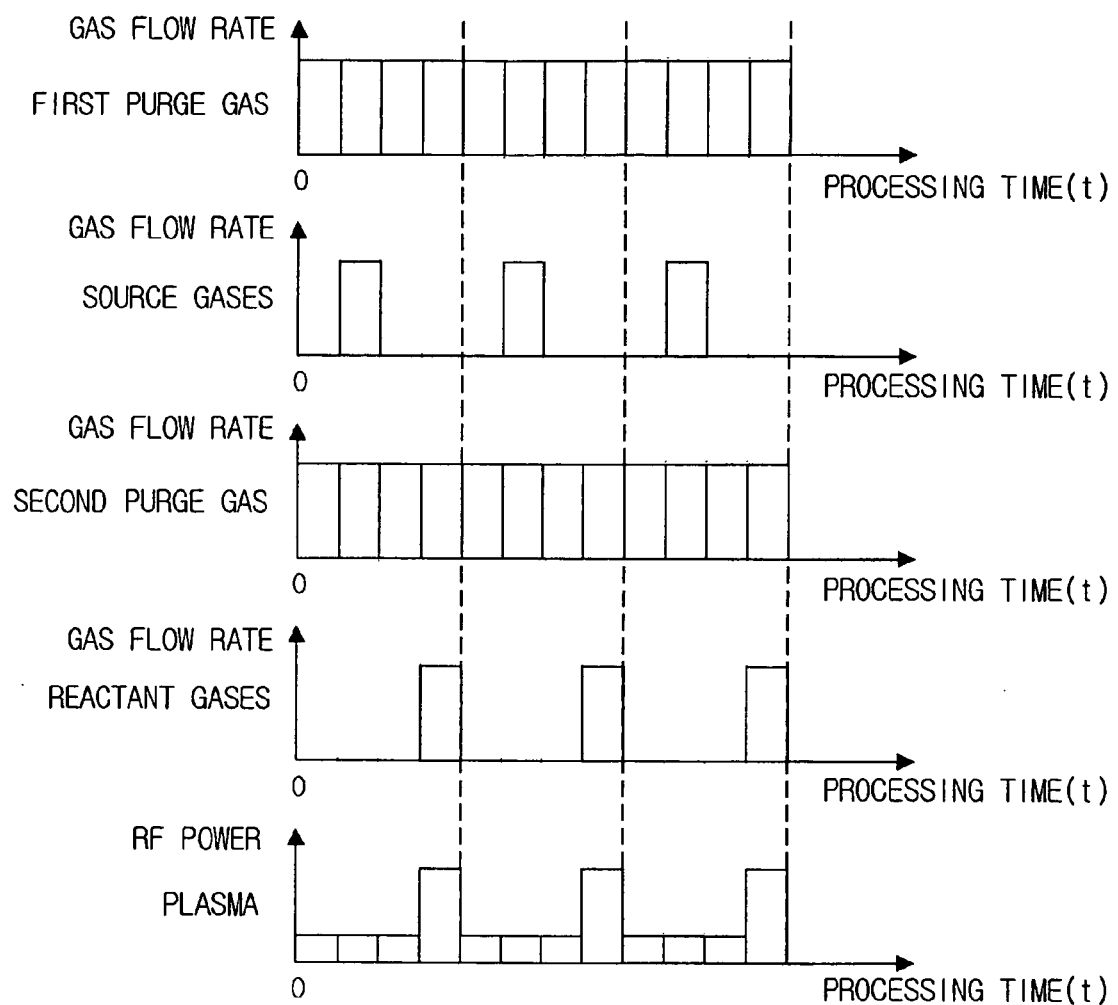

FIGS. 9 and 10 are graphs illustrating the sequential supply of the process gases consisting of the processes of injecting and purging the source gases, injecting the radicals of the reactant gases, and purging the reactant gases while maintaining a more stable state of the plasma in the chemical vapor deposition apparatus according to the present invention.

As shown in FIG. 9, although the state where the plasma is generated in the showerhead is maintained by applying electric power from a low RF power source (or low power source for the external plasma generating apparatus), the plasma is under a very low energy condition. Thus, the plasma is controlled to be extinguished by the recombination phenomenon due to collision with inner walls of the radical injection holes, so that the radicals are controlled not to be introduced into the chamber. In such a manner that the plasma state is maintained in the showerhead and the radicals are not introduced into the chamber, a more stable plasma state can be maintained upon sequential supply of the radicals of the reactant gases while not affecting the process reactions. Further, as shown in FIG. 10, it is possible to minimize time needed for purging the source gases and the reactant gases by continuously introducing the first and second purge gases. In addition, the reproducibility of the processes can be ensured by minimizing variations in the pressure of the chamber.

Figure 11:
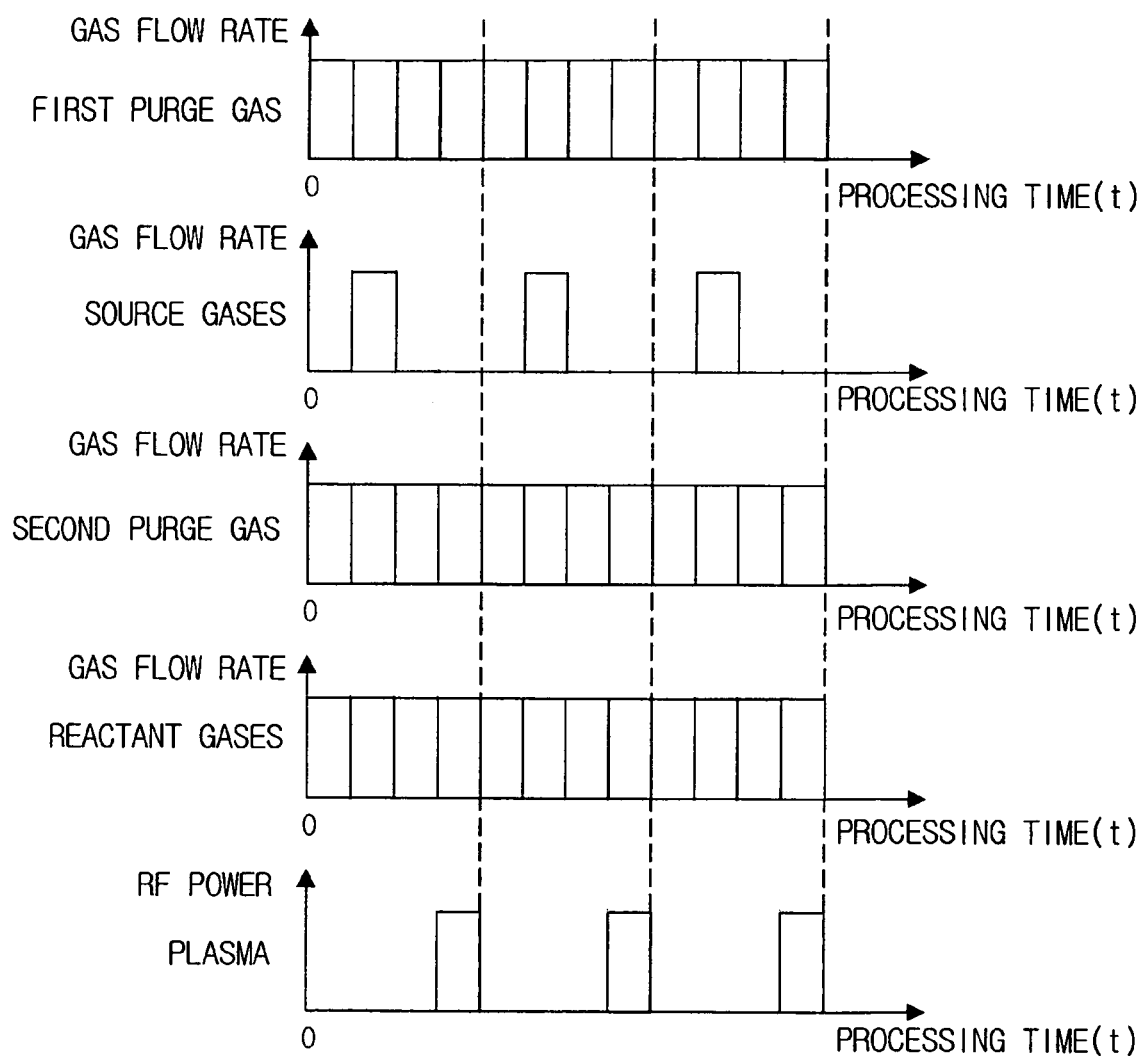
FIG. 11 is a graph showing a process of sequentially supplying the process gases and the radicals of the reactant gases while maintaining a more stable pressure of a chamber upon supply of source gases and reactant gases, which have difficulty in being deposited at a lower temperature, in the chemical vapor deposition apparatus according to the present invention.

FIG. 11 is a graph diagrammatically illustrating the sequential supply of the process gases consisting of the processes of injecting and purging the source gases, injecting the radicals of the reactant gases, and purging the reactant gases while maintaining a more stable pressure of the chamber during supply of the source gases and the reactant gases in the chemical vapor deposition apparatus according to the present invention.

As shown in FIG. 11, it is possible to minimize variations in the pressure of the chamber by continuously introducing the reactant gases during a low temperature process where the source gases do not react with the reactant gases. Thus, the reproducibility of the processes can be further improved.

One of major factors in determining the deposition rate of the chemical vapor deposition apparatus in which the process gases are sequentially supplied is an adsorption ratio of the source gases with respect to the wafer or substrate. In order to increase the adsorption ratio of the source gases, the reactant gases are supplied even in a state where the plasma is not generated. In such a way, the adsorption ratio of the source gases can be improved. The deposition rate of the thin film can be enhanced by cutting off and purging the source gases, generating the plasma, and then forming the thin film by means of the radicals of the reactant gases using the reactant gases and the source gases adsorbed on the wafer or substrate.

Figure 12:
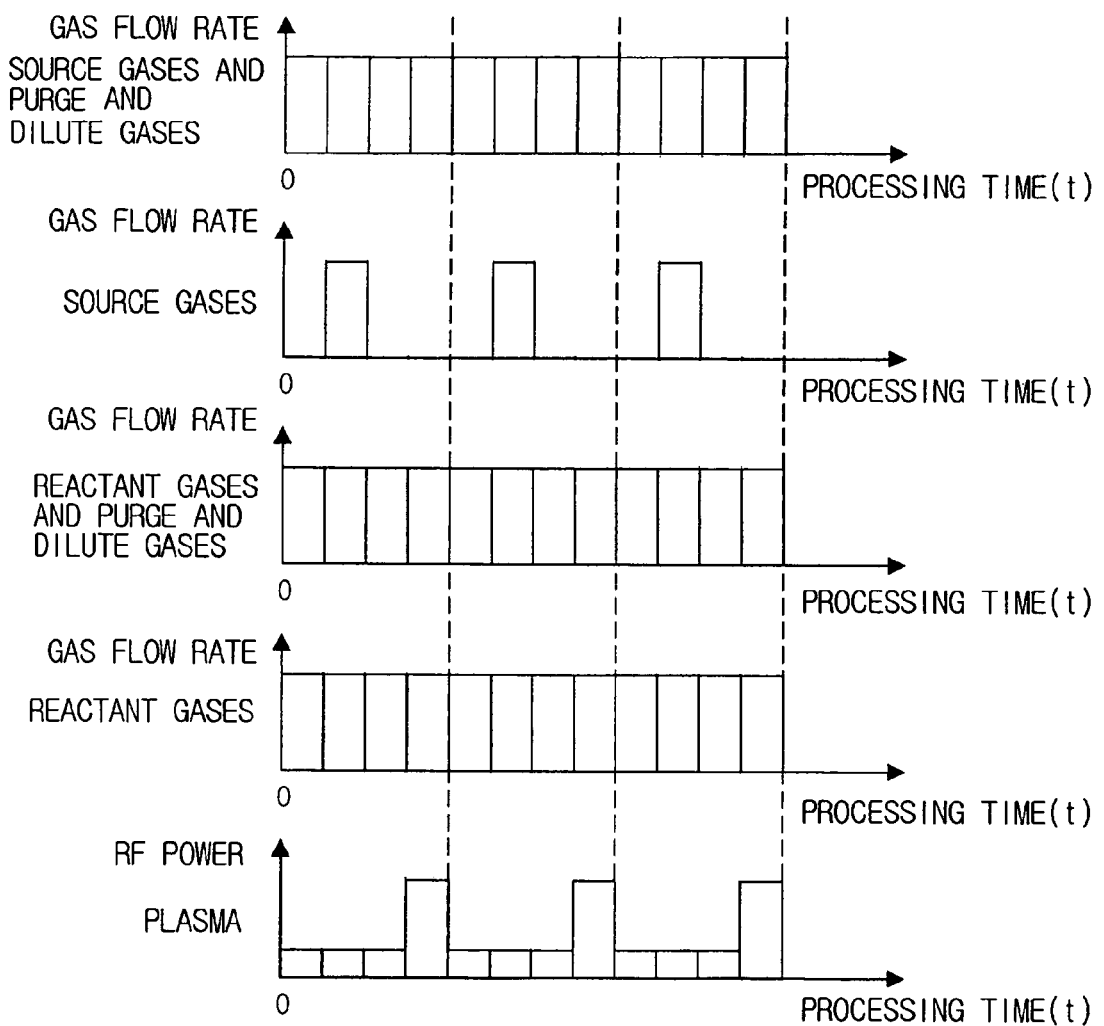
FIG. 12 is a graph showing a process of sequentially supplying the process gases and the radicals of the reactant gases while maintaining a more stable pressure of the chamber and a more stable state of the plasma upon supply of source gases and reactant gases, which have difficulty in being deposited at a lower temperature and in a low energy plasma state, in the chemical vapor deposition apparatus according to the present invention.

FIG. 12 is a graph diagrammatically illustrating the sequential supply of the process gases consisting of the processes of injecting and purging the source gases, injecting the radicals of the reactant gases, and purging the reactant gases while stably maintaining the pressure of the chamber and the state of the plasma during the supply of the source gases and the reactant gases, which are not typically deposited at a lower temperature and in a low energy plasma state, in the chemical vapor deposition apparatus according to the present invention.

As shown in FIG. 12, the reactant gases are continuously introduced during a process where the source gases do not react with the reactant gases at a low temperature, and during the state where the plasma generated in the showerhead is maintained by applying the electric power from the low RF power source (or low power source for the external plasma generating apparatus). However, the plasma has a very low energy state. Thus, the plasma or radicals are extinguished by the recombination phenomenon when they collide with the inner walls of the radical injection holes. Thus, the radicals of the reactant gases are not introduced into the chamber. Even in a state where the reactant gases are continuously introduced and the plasma state is generated in the showerhead by means of the low electric power, the pressure of the chamber and the plasma state can be maintained more stably upon sequential supply of the process gases without affecting the process reaction.

As described in detail above, the chemical vapor deposition apparatus of the present invention can improve the low deposition rate that was a problem of a conventional chemical vapor deposition apparatus in which the process gases are sequentially supplied, and prevent the problems of the generation of plasma arc, the ion bombarding, the ion implant, and the like. In addition, it can prevent introduction of a large amount of particles and impurities such as C, H, Cl, Br, I and O which may be contained in the thin film deposited by the chemical vapor deposition method.

Moreover, according to the chemical vapor deposition apparatus of the present invention, there is an advantage in that a high quality thin-film can be formed by a low temperature process and thus reliability of the process is improved. There is also another advantage in that excellent step coverage characteristics and a high deposition rate can be ensured and thus the manufacture yield of products is enhanced.

Although the technical details of the chemical vapor deposition apparatus according to the present invention have been described with reference to the accompanying drawings, they merely exemplify the preferred embodiments of the present invention and do not limit the invention.

Further, it will be apparent to those skilled in the art that various modifications and changes can be made to the invention without departing from the technical spirit and scope of the invention.

What is claimed is:

1. A chemical vapor deposition method for forming a thin film on a substrate or a wafer, which are arranged in a process chamber, by introducing, in turn, a source gas, a second purge gas, a reactant gas and a first purge gas, the method comprises steps of:

a) injecting the source gas into the chamber so that the source gas is adsorbed on the substrate;

b) injecting the second purge gas into the chamber for a predetermined period of time so that the source gas remaining in the chamber is purged;

c) injecting the reactant gas into a plasma generating portion arranged between a RF electrode plate and a showerhead, said showerhead is electrically grounded, and generating plasma at the plasma generating portion by applying a first-level RF power source to the RF electrode plate so that radical of the reactant gas is adsorbed on the substrate;

d) injecting the first purge gas into the chamber for a predetermined period of time so that the reactant gas remaining in the chamber is purged;

e) applying a second-level RF power source to the plasma generating portion at the step a), b) and d) while the steps a) to d) are being repeated; and wherein an energy level of the second-level RF power source generates radicals whose energy level does not exceed the energy level that the showerhead can reduce to a ground state as the radical passes through the showerhead.

2. The chemical vapor deposition method according to claim 1, wherein the purge gas is continuously injected in the chamber.

3. The chemical vapor deposition method according to claim 1, wherein the reactant gas is continuously injected in the plasma-generating portion.

* * * * *